US012763161B2

(12) United States Patent
Kim et al.

(10) Patent No.: US 12,763,161 B2
(45) **Date of Patent: *Oct. 13, 2026**

(54) NONVOLATILE MEMORY INCLUDING ON-DIE-TERMINATION CIRCUIT AND STORAGE DEVICE INCLUDING THE NONVOLATILE MEMORY

(71) Applicant: SAMSUNG ELECTRONICS CO., LTD., Suwon-si (KR)

(72) Inventors: Eun-Ji Kim, Suwon-si (KR); Jung-June Park, Seoul (KR); Jeong-Don Ihm, Seongnam-si (KR); Byung-Hoon Jeong, Hwaseong-si (KR); Young-Don Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/776,432

(22) Filed: Jul. 18, 2024

(65) Prior Publication Data

US 2024/0371457 A1 Nov. 7, 2024

Related U.S. Application Data

(63) Continuation of application No. 18/361,132, filed on Jul. 28, 2023, now Pat. No. 12,073,898, which is a
(Continued)

(30) Foreign Application Priority Data

Sep. 20, 2017 (KR) ........................ 10-2017-0121313

(51) Int. Cl.
*G11C 7/10* (2006.01)
*G11C 5/06* (2006.01)
(Continued)

(52) U.S. Cl.
CPC ............ *G11C 29/025* (2013.01); *G11C 5/063* (2013.01); *G11C 7/1048* (2013.01);
(Continued)

(58) Field of Classification Search
CPC ....... G11C 7/10; G11C 7/1048; G11C 7/1057; G11C 7/1084; H03K 19/0005;
(Continued)

(56) References Cited

U.S. PATENT DOCUMENTS 6,356,106 B1 * 3/2002 Greeff ................. G06F 13/4086 333/32
7,372,293 B2 5/2008 Cox et al.
(Continued)

FOREIGN PATENT DOCUMENTS

CN 101529394 9/2009
CN 102194515 9/2011
(Continued)

OTHER PUBLICATIONS

1st Office Action dated Aug. 18, 2021 corresponding to KR Patent Application No. 10-2017-0121313.
(Continued)

*Primary Examiner* — Jason M Crawford
(74) *Attorney, Agent, or Firm* — Morgan, Lewis & Bockius LLP

(57) ABSTRACT

A nonvolatile memory (NVM) device includes a data pin, a control pin, an on-die termination (ODT) pin, and a plurality of NVM memory chips commonly connected to the data pin and the control pin. A first NVM chip among the NVM chips includes an ODT circuit. The first NVM chip determines one of an ODT write mode and an ODT read mode based on a control signal received through the control pin and an ODT signal received through the ODT pin, uses the ODT circuit to perform an ODT on the data pin during the ODT write
(Continued)

mode, and uses the ODT circuit to perform the ODT on the control pin during the ODT read mode.

20 Claims, 25 Drawing Sheets

Related U.S. Application Data continuation of application No. 17/704,345, filed on Mar. 25, 2022, now Pat. No. 11,742,040, which is a continuation of application No. 17/161,995, filed on Jan. 29, 2021, now Pat. No. 11,342,038, which is a continuation of application No. 16/862,624, filed on Apr. 30, 2020, now Pat. No. 11,024,400, which is a continuation of application No. 16/458,933, filed on Jul. 1, 2019, now Pat. No. 10,559,373, which is a continuation of application No. 16/426,391, filed on May 30, 2019, now Pat. No. 10,679,717, which is a continuation of application No. 15/977,553, filed on May 11, 2018, now Pat. No. 10,340,022.

(60) Provisional application No. 62/506,641, filed on May 16, 2017.

(51) Int. Cl.

| | |
|---|---|
| ***G11C 16/06*** | (2006.01) |
| ***G11C 16/10*** | (2006.01) |
| ***G11C 16/26*** | (2006.01) |
| ***G11C 29/02*** | (2006.01) |

(52) U.S. Cl.
CPC .......... *G11C 7/1057* (2013.01); *G11C 7/1084* (2013.01); *G11C 16/06* (2013.01); *G11C 16/102* (2013.01); *G11C 16/26* (2013.01); *G11C 29/022* (2013.01); *G11C 29/028* (2013.01)

(58) Field of Classification Search
CPC ....... H03K 19/0175; H03K 19/017545; H03K 19/018557; H03K 19/1776
See application file for complete search history.

(56) References Cited

U.S. PATENT DOCUMENTS

| | | | | |
|---|---|---|---|---|
| 7,414,426 | B2 | 8/2008 | Cox et al. | |
| 7,457,175 | B1 * | 11/2008 | Griffith | G06F 13/1689 365/233.1 |
| 8,243,534 | B2 | 8/2012 | Fujisawa | |
| 8,274,308 | B2 | 9/2012 | McCall et al. | |
| 8,436,641 | B2 | 5/2013 | Song | |
| 8,619,492 | B2 | 12/2013 | Jeon | |
| 8,665,663 | B2 | 3/2014 | Mazumder et al. | |
| 8,988,101 | B2 | 3/2015 | Song et al. | |
| 9,153,296 | B2 | 10/2015 | McCall et al. | |
| 9,196,321 | B2 | 11/2015 | Huber et al. | |
| 10,340,022 | B2 * | 7/2019 | Kim | G11C 16/102 |
| 10,559,373 | B2 * | 2/2020 | Kim | G11C 7/1057 |
| 10,679,717 | B2 * | 6/2020 | Kim | G11C 29/025 |
| 11,024,400 | B2 * | 6/2021 | Kim | G11C 7/1084 |
| 11,342,038 | B2 * | 5/2022 | Kim | G11C 16/06 |
| 11,742,040 | B2 * | 8/2023 | Kim | G11C 29/028 326/30 |
| 12,073,898 | B2 * | 8/2024 | Kim | G11C 16/102 |
| 2003/0099138 | A1 * | 5/2003 | Kyung | G11C 7/1072 365/200 |
| 2003/0234664 | A1 * | 12/2003 | Yamagata | G11C 7/10 710/100 |
| 2004/0228196 | A1 | 11/2004 | Kwak et al. | |
| 2006/0106951 | A1 * | 5/2006 | Bains | G06F 13/4086 710/5 |
| 2006/0262586 | A1 * | 11/2006 | Solomon | G06F 12/0207 365/63 |
| 2007/0247185 | A1 * | 10/2007 | Oie | H04L 25/0298 326/30 |
| 2008/0030221 | A1 * | 2/2008 | Lee | H04L 25/0278 326/30 |
| 2009/0230989 | A1 * | 9/2009 | Murayama | G11C 29/028 326/26 |
| 2009/0273960 | A1 * | 11/2009 | Kim | G11C 7/109 365/191 |
| 2010/0013516 | A1 * | 1/2010 | Kyung | G11C 13/0069 326/30 |
| 2010/0226185 | A1 * | 9/2010 | Lee | G11C 7/1084 365/189.05 |
| 2011/0095783 | A1 * | 4/2011 | Ferolito | G06F 13/4086 326/30 |
| 2011/0205832 | A1 | 8/2011 | Jeon | |
| 2012/0113733 | A1 * | 5/2012 | Kim | G11C 5/063 365/191 |
| 2012/0326746 | A1 * | 12/2012 | McCall | G11C 11/4093 326/30 |
| 2016/0087630 | A1 * | 3/2016 | Park | H03K 19/0005 326/30 |
| 2016/0189758 | A1 | 6/2016 | Desireddi et al. | |
| 2017/0110175 | A1 * | 4/2017 | Kim | G11C 11/4093 |
| 2017/0110178 | A1 * | 4/2017 | Bains | G11C 8/12 |
| 2017/0154668 | A1 * | 6/2017 | Ha | G11C 29/021 |
| 2017/0194962 | A1 * | 7/2017 | Bains | G06F 3/0673 |
| 2017/0288634 | A1 * | 10/2017 | Kang | G11C 16/08 |
| 2018/0293191 | A1 | 10/2018 | Li | |
| 2018/0336958 | A1 * | 11/2018 | Kim | G11C 29/025 |
| 2019/0279733 | A1 | 9/2019 | Kim et al. | |
| 2020/0258589 | A1 * | 8/2020 | Kim | G11C 5/063 |
| 2021/0151117 | A1 * | 5/2021 | Kim | G11C 29/022 |
| 2022/0215892 | A1 * | 7/2022 | Kim | G11C 16/26 |
| 2024/0021259 | A1 * | 1/2024 | Kim | G11C 16/06 |
| 2024/0371457 | A1 * | 11/2024 | Kim | G11C 16/26 |

FOREIGN PATENT DOCUMENTS

| | | |
|---|---|---|
| CN | 102456406 | 5/2012 |
| CN | 10560827 | 5/2016 |
| KR | 1020120048750 | 5/2012 |
| KR | 10-2013-0030277 | 3/2013 |
| KR | 1020150047635 | 5/2015 |

OTHER PUBLICATIONS

1st Office Action Dated Mar. 28, 2022 In Corresponding CN Patent Application No. 201810466576.5.

2nd Office Action dated Feb. 24, 2022 in corresponding KR Patent Appliction No. 10-2017-0121313.

Notice of Allowance dated Apr. 13, 2023 in corresponding U.S. Appl. No. 17/704,345.

Notice of Allowance dated Aug. 22, 2022 in corresponding KR Patent Application No. 10-2017-0121313.

Notice of Allowance dated Dec. 8, 2021 in corresponding U.S. Appl. No. 17/161,995.

Office Action dated Feb. 15, 2023 in corresponding U.S. Appl. No. 17/704,345.

Office Action Dated Nov. 20, 2020 In Related U.S. Appl. No. 16/862,624.

Search Report and Written Opinion Dated Feb. 13, 2019 From Intellectual Property Office of Singapore in Corresponding Application No. 10201803733V.

Notice of Allowance dated May 15, 2024 in corresponding U.S. Appl. No. 18/361,132.

* cited by examiner

WRITE OPERATION

READ OPERATION

WRITE OPERATION

READ OPERATION

NONVOLATILE MEMORY INCLUDING ON-DIE-TERMINATION CIRCUIT AND STORAGE DEVICE INCLUDING THE NONVOLATILE MEMORY

CROSS-REFERENCE TO RELATED APPLICATIONS

This application is a continuation of U.S. patent application Ser. No. 18/361,132 filed Jul. 28, 2023, which is a continuation of U.S. patent application Ser. No. 17/704,345 filed Mar. 25, 2022, issued as U.S. Pat. No. 11,742,040 on Aug. 29, 2023, which is a continuation of U.S. patent application Ser. No. 17/161,995 filed Jan. 29, 2021, issued as U.S. Pat. No. 11,342,038 on May 24, 2022, which is a continuation of U.S. patent application Ser. No. 16/862,624 filed Apr. 30, 2020, issued as U.S. Pat. No. 11,024,400 on Jun. 1, 2021, which is a continuation of U.S. patent application Ser. No. 16/458,933 filed Jul. 1, 2019, issued as U.S. Pat. No. 10,559,373 on Feb. 11, 2020, which is a continuation of U.S. patent application Ser. No. 16/426,391 filed May 30, 2019, issued as U.S. Pat. No. 10,679,717 on Jun. 9, 2020, which is a continuation of U.S. patent application Ser. No. 15/977,553 filed May 11, 2018, issued as U.S. Pat. No. 10,340,022 on Jul. 2, 2019, which claims the benefit of U.S. Patent Application No. 62/506,641, filed on May 16, 2017, in the U.S. Intellectual Property Office, and Korean Patent Application No. 10-2017-0121313, filed on Sep. 20, 2017, in the Korean Intellectual Property Office, the disclosures of which are incorporated by reference in their entireties herein.

BACKGROUND

1. Technical Field

The inventive concept relates to a memory device, and more particularly, to a nonvolatile memory including an on-die-termination (hereinafter, referred to as "ODT") circuit, a storage device including the nonvolatile memory, and a method of operating the storage device.

2. Discussion of Related Art

A storage device may include a nonvolatile memory and a controller configured to control the nonvolatile memory. Communication between the nonvolatile memory and the controller may be performed at a relatively lower operation frequency than communication performed in a memory system including a high speed memory, such as dynamic random-access memory (DRAM) or static random-access memory (SRAM). Accordingly, the quality of the signal (e.g., signal integrity) between the nonvolatile memory and the controller was not a critical factor for the overall performance of the storage device. However, recently, high speed operation of the storage device has been required, and thus, signal integrity has become a more important factor for the storage device in order to improve the overall performance of a computing system or a mobile communication system that includes the memory device.

SUMMARY

According to an exemplary embodiment of the inventive concept, a nonvolatile memory (NVM) device is provided. The NVM device includes a data pin, a control pin, an on-die termination (ODT) pin, and a plurality of NVM memory chips commonly connected to the data pin and the control pin. A first NVM chip among the NVM chips includes an ODT circuit. The first NVM chip determines one of an ODT write mode and an ODT read mode based on a control signal received through the control pin and an ODT signal received through the ODT pin, uses the ODT circuit to perform an ODT on the data pin during the ODT write mode, and uses the ODT circuit to perform the ODT on the control pin during the ODT read mode.

According to an exemplary embodiment of the inventive concept, a nonvolatile memory (NVM) device is provided. The NVM device includes a data pin, a control pin, a first on-die termination (ODT) pin, a second ODT pin, and a plurality of NVM memory chips commonly connected to the data pin and the control pin. A first NVM chip among the NVM chips includes an ODT circuit. The first NVM chip determines one of an ODT write mode and an ODT read mode based on a first ODT signal received through the first ODT pin and a second ODT signal received through the second ODT pin, uses the ODT circuit to perform an ODT on the data pin during the ODT write mode, and uses the ODT circuit to perform the ODT on the control pin during the ODT read mode.

According to an exemplary embodiment of the inventive concept, a nonvolatile memory (NVM) device is provided. The NVM device includes a data pin, a first control pin, a second control pin, and a plurality of NVM memory chips commonly connected to the data pin and the first control pin. The first NVM chip determines one of an ODT write mode and an ODT read mode based on a first control signal received through the first control pin and a second control signal received through the second control pin, uses the ODT circuit to perform an ODT on the data pin during the ODT write mode, uses the ODT circuit to perform the ODT on the first control pin during the ODT read mode when the first control signal is a read enable signal, and uses the ODT circuit to perform the ODT on a read enable pin of the NVM device during the ODT read mode when the first and second control signals indicate whether the ODT is to be performed on the data pin or the read enable pin.

BRIEF DESCRIPTION OF THE DRAWINGS

Exemplary Embodiments of the inventive concept will be more clearly understood from the following detailed description taken in conjunction with the accompanying drawings in which.

DETAILED DESCRIPTION OF THE EMBODIMENTS

Figure 1:
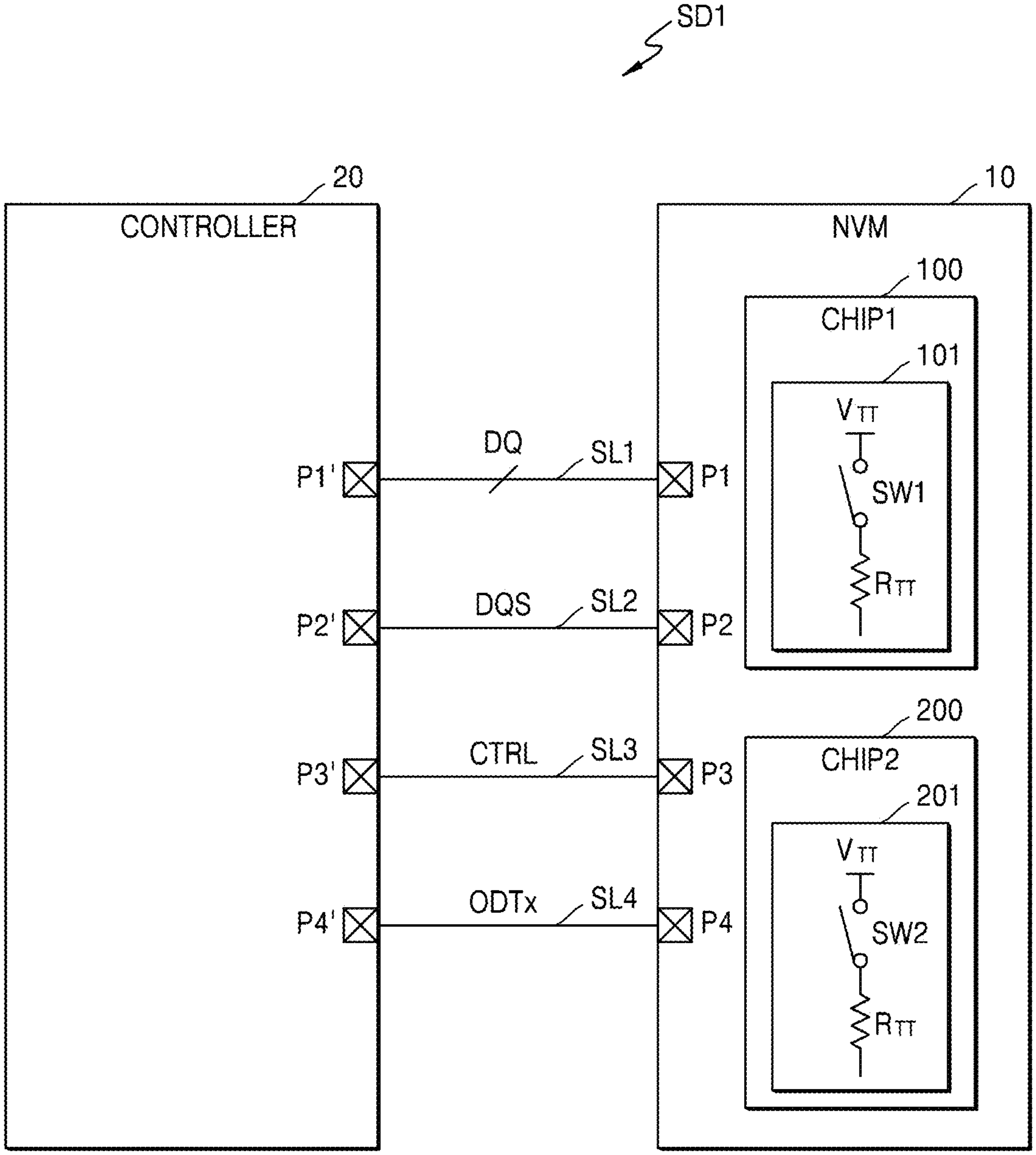
FIG. 1 is block diagram schematically showing a storage device according to an exemplary embodiment of the inventive concept.

FIG. 1 is a block diagram schematically showing a storage device SD1 according to an exemplary embodiment of the inventive concept.

Referring to FIG. 1, the storage device SD1 includes a nonvolatile memory (NVM) 10 and a controller 20 (e.g., a control circuit), and the NVM 10 includes a first NVM chip 100 and a second NVM chip 200. The NVM 10 may include a plurality of NVM chips including at least the first and second NVM chips 100 and 200, and thus, may be referred to as "a multi-chip memory." For example, each of the first and second NVM chips 100 and 200 may be a dual die package (DDP) or a quadruple die package (QDP). Each NVM chip may include a plurality of memory blocks.

The first NVM chip 100 includes an on-die-termination (ODT) circuit 101, and the second NVM chip 200 includes an ODT circuit 201. According to an embodiment, each of the first and second NVM chips 100 and 200 is a NAND flash memory chip. However, the present inventive concept is not limited thereto. For example, at least one of the first and second NVM chips 100 and 200 may be a resistive memory chip, such as resistive random-access memory (ReRAM), phase change RAM (PRAM), and magnetic RAM (MRAM). Hereinafter, the first and second NVM chips 100 and 200 will be referred to as the first and second chips 100 and 200, for convenience.

The NVM 10 and the controller 20 communicate with each other via first through fourth signal lines SL1 through SL4. Commands and addresses may be transmitted via the first signal lines SL1, and data signals DQ may be transmitted via the first signal lines SL1. For example, the addresses indicate locations in the NVM 10, the data signals DQ include data, and the commands may include a write command that indicates an address to write the data or a read command that indicates an address to receive the data from. The first signal lines SL1 may be referred to as input and output lines or input and output buses. Hereinafter, descriptions will be given by focusing on operations of the ODT circuits 101 and 201 in a section in which the data signals DQ are transmitted via the first signal lines SL1. Here, the first signal lines SL1 may be referred to as data lines or data buses. A data strobe signal (DQS) may be transmitted via the second signal line SL2, and the second signal line SL2 may be referred to as a data strobe signal line or a data strobe signal bus. A control signal CTRL may be transmitted via the third signal line SL3, and the third signal line SL3 may be referred to as a control signal line. An ODT signal (ODTx) may be transmitted via the fourth signal line SL4, and the fourth signal line SL4 may be referred to as an ODT signal line.

During a write operation, the controller 20 outputs a write command and an address, and then outputs the data signals DQ and the data strobe signal DQS. During a read operation, the controller 20 outputs a read command and an address, and then receives the data signals DQ. In an embodiment, the data strobe signal DQS is toggled at a high speed first frequency. Thus, the data strobe signal DQS may be reflected from the first or the second memory chip 100 or 200, which is non-selected. Examples of the high speed first frequency includes 400 MHZ, 500 MHZ, 600 MHz, etc.

The controller 20 generates the ODT signal ODTx to control the ODT circuits 101 and 201, and the control signal CTRL to control operations of the first and second memory chips 100 and 200. In an exemplary embodiment, the ODT signal ODTx controls when to enable (e.g., activate) or disable (e.g., deactivate) the ODT circuits 101 and 201. According to an embodiment, the control signal CTRL includes a read enable signal nREx for enabling a read operation of the first and second memory chips 100 and 200. In an embodiment, the read enable signal nREx is toggled at a high speed second frequency. Thus, the read enable signal nREx may be reflected from the first or the second memory chip 100 or 200, which is non-selected. For example, the selected memory chip may be the memory chip that is read from or written to (e.g., processes a read or write command), whereas the non-selected memory chip may be the memory chip that is standing by (e.g., not currently processing a read or a write command). In an exemplary embodiment, the first frequency and the second frequency are the same.

According to an embodiment, during a section (e.g., time period) in which the data strobe signal DQS is toggled at the first frequency for a write operation, the controller 20 activates the ODT signal ODTx to prohibit the data strobe signal DQS from being reflected from the first or the second memory chip 100 or 200, which is non-selected and in a stand-by state. According to an embodiment, during a section in which the read enable signal nREx is toggled at the second frequency for a read operation, the controller 20 activates the ODT signal ODTx to prohibit the read enable signal nREx from being reflected from the first or the second memory chip 100 or 200, which is non-selected and in a stand-by state.

The NVM 10 includes first through fourth pins P1 through P4, and the first and second memory chips 100 and 200 may be commonly connected to each of the first through fourth pins P1 through P4. The first through fourth pins P1 through P4 may be referred to as first through fourth pads. The first pins P1 are connected to the first signal lines SL1, respectively, and may be referred to as input and output pins or data pins. The second pin P2 is connected to the second signal line SL2, and may be referred to as a data strobe signal pin. The third pin P3 is connected to the third signal line SL3, and may be referred to as a control signal pin. The fourth pin P4 is connected to the fourth signal line SL4, and may be referred to as an ODT pin. In an embodiment, the controller 20 is configured to output an ODT setting command to the NVM 10 indicating whether ODT is permissible (e.g., permissible on the data pin DQ, the data strobe pin DQS, the control pin CTRL, etc.), and the NVM 10 is configured to interpret/execute the ODT setting command. For example, upon receiving the ODT setting command, the NVM 10 could configure one or more of its pins to be an ODT pin that receives an ODT signal. Meanwhile, the controller 20 includes first through fourth pins P1' through P4' connected to the first through fourth signal lines SL1 through SL4, respectively.

For example, the second signal line SL2 may be commonly connected to the first and second memory chips 100 and 200 via the second pin P2, and the data strobe signal DQS transmitted via the second signal line SL2 may be commonly applied to the first and second memory chips 100 and 200. For example, when the first memory chip 100 is non-selected and the second memory chip 200 is selected, the data strobe signal DQS may be reflected from the first memory chip 100, which is in a stand-by state.

However, according to the present embodiment, the NVM 10 receives the ODT signal ODTx from the controller 20 via the fourth pin P4. The non-selected first memory chip 100 enables the ODT circuit 101 based on the ODT signal ODTx, and the ODT circuit 101 becomes connected to the second signal line SL2. In an embodiment, connection of an ODT circuit to a signal line may attach a termination resistance to that signal line. Accordingly, the data strobe signal DQS may be prohibited from being reflected from the first memory chip 100 in the stand-by state, and thus, a signal integrity margin may be improved.

According to an exemplary embodiment, the NVM 10 receives the control signal CTRL from the memory controller 20 via the third pin P3. The first memory chip 100, which is non-selected, determines whether an operation with respect to the second memory chip 200, which is selected, is a write operation or a read operation, based on the control signal CTRL, and determines an ODT mode based on a result of the determination. For example, the control signal CTRL may be a read enable signal nREx. Hereinafter, descriptions will be given by focusing on embodiments in which the control signal CTRL is the read enable signal nREx. However, the present inventive concept is not limited thereto, and the control signal CTRL may be at least one of various control signals indicating operations of the NVM 10. In an exemplary embodiment, the NVM 10 may modify an impedance of the ODT circuit 101 based on an impedance signal received through the first pin P1.

The ODT circuit 101 includes an ODT switch SW1 and an ODT resistor $R_{TT}$ connected in series. The ODT switch SW1 is connected between a power voltage terminal $V_{TT}$ and the ODT resistor $R_{TT}$, and is driven based on the ODT signal ODTx and the control signal CTRL. A voltage provided to the power voltage terminal $V_{TT}$ may be the same as a power supply voltage supported the NVM 10. An end of the ODT resistor $R_{TT}$ is connected to the ODT switch SW1 and the other end of the ODT resistor $R_{TT}$ may be connected to one of the first through third signal lines SL1 through SL3. When the ODT switch SW1 is turned on (e.g., closed) in response to the ODT signal ODTx and the control signal CTRL, the power voltage terminal $V_{TT}$ is connected to one of the first through third signal lines SL1 through SL3. However, structures of the ODT circuit 101 are not limited thereto. For example, the ODT resistor $R_{TT}$ may be arranged between the power voltage terminal $V_{TT}$ and the ODT switch SW1. The ODT circuit 201 includes the ODT resistor $R_{TT}$ and an ODT switch SW2 connected in series and may be implemented substantially the same as the ODT circuit 101. In an embodiment, an ODT switch (e.g., SW1 or SW2) is implemented by a transistor.

When the NVM 10 does not include the fourth pin P4, the controller 20 may transmit an ODT enable command to the first memory chip 100, before transmitting a write command or a read command to the second memory chip 200. However, in this case, command overhead is increased since the controller 20 spends more time inputting commands to the NVM 10. In particular, when the NVM 10 includes three or more memory chips, the number of non-selected memory chips may be two or more. Here, since the ODT enable command has to be transmitted to each of the non-selected memory chips, the command overhead may further be increased.

However, according to the present embodiment shown in FIG. 1, the NVM 10 includes the fourth pin P4, and the first and second memory chips 100 and 200 are commonly connected to the fourth pin P4 so as to receive the ODT signal ODTx. Thus, while the controller 20 transmits the write command or the read command with respect to the second memory chip 200 through the first signal lines SL1, the controller 20 may simultaneously transmit the ODT signal ODTx through the fourth signal line SL4. The ODT signal ODTx defines a time period (e.g., an enable section) during which the ODT circuit 101 included in the first memory chip 100 is to be activated when the first memory chip 100 is not selected and the second memory chip 200 is selected. Therefore, the command overhead may be decreased, and the performance of the storage device SD1 may be improved.

In an exemplary embodiment, the storage device SD1 is an internal memory mounted in an electronic apparatus. For example, the storage device SD1 may be a solid state drive (SSD), an embedded universal flash storage (UFS) memory device, or an embedded multimedia card (eMMC). In an exemplary embodiment, the storage device SD1 is an external memory detachable from the electronic apparatus. For example, the storage device SD1 may include a UFS memory card, compact flash (CF), secure digital (SD), micro secure digital (Micro-SD), mini secure digital (Mini-SD), extreme digital (xD), or a memory stick.

Figure 2:
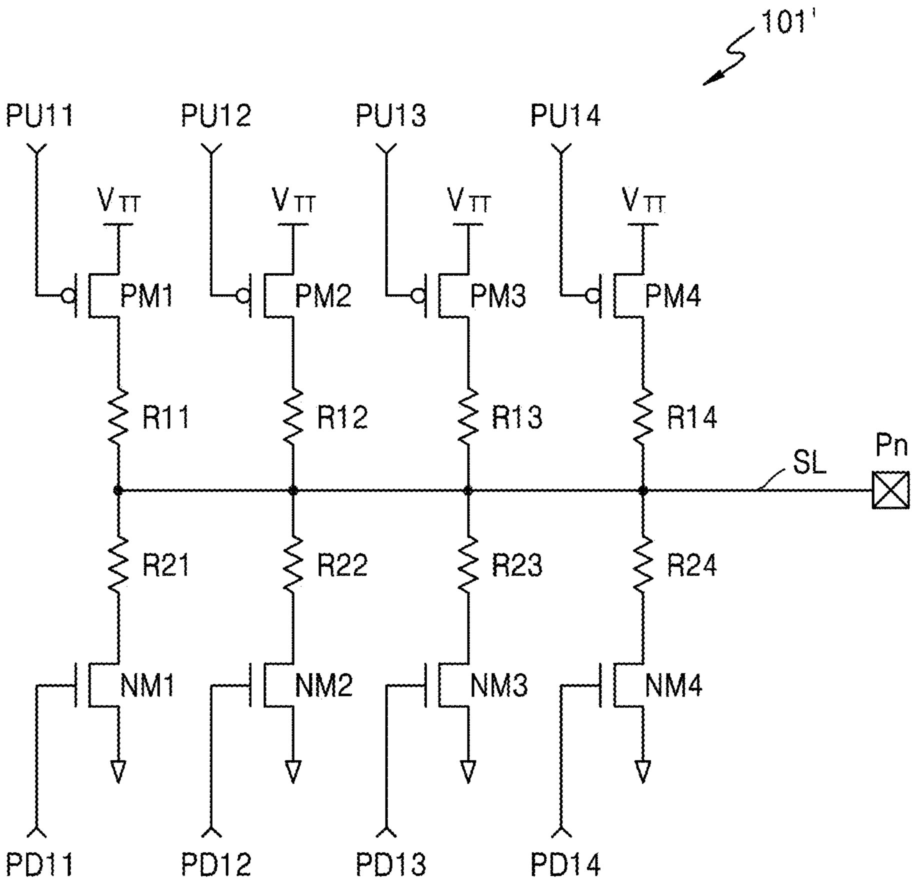
FIG. 2 is a circuit diagram of an example of an on-die-termination (ODT) circuit of FIG. 1.

FIG. 2 is a circuit diagram of an example 101' of the ODT circuit 101 of FIG. 1 according to an exemplary embodiment of the inventive concept.

Referring to FIG. 2, the ODT circuit 101' includes p-type metal oxide semiconductor (PMOS) transistors PM1 through PM4, n-type metal oxide semiconductor (NMOS) transistors NM1 through NM4, and resistors R11 through R24. The number of PMOS transistors, the number of NMOS transistors, and the number of resistors may vary according to embodiments. The PMOS transistors PM1 through PM4 may be turned on or turned off based on control signals PU11 through PU14 corresponding to the PMOS transistors PM1 through PM4, and the NMOS transistors NM1 through NM4 may be turned on or turned off based on control signals PD11 through PD14 corresponding to the NMOS transistors NM1 through NM4. For example, the control signals PU11 through PU14 and PD11 through PD14 may correspond to a first ODT control signal ODT_EN1 or a second ODT control signal ODT_EN2 of FIG. 6.

Accordingly, some of the resistors R11 through R24 may be connected to a pin Pn via a signal line SL, and a termination resistance of the ODT circuit 101' may be determined For example, the termination resistance of the ODT circuit 101' may be determined by the resistors that remain connected to the pin Pn. The pin Pn may be one of the first through third pins P1 through P3 of FIG. 1 and may be adjusted to be the same as an impedance of the signal line SL corresponding to the termination resistance of the ODT circuit 101'. Accordingly, the ODT circuit 101' may absorb energy of a signal transmitted via the signal line SL corresponding to the ODT circuit 101', and may prohibit reflection of signals from a receiving terminal.

Figure 3:
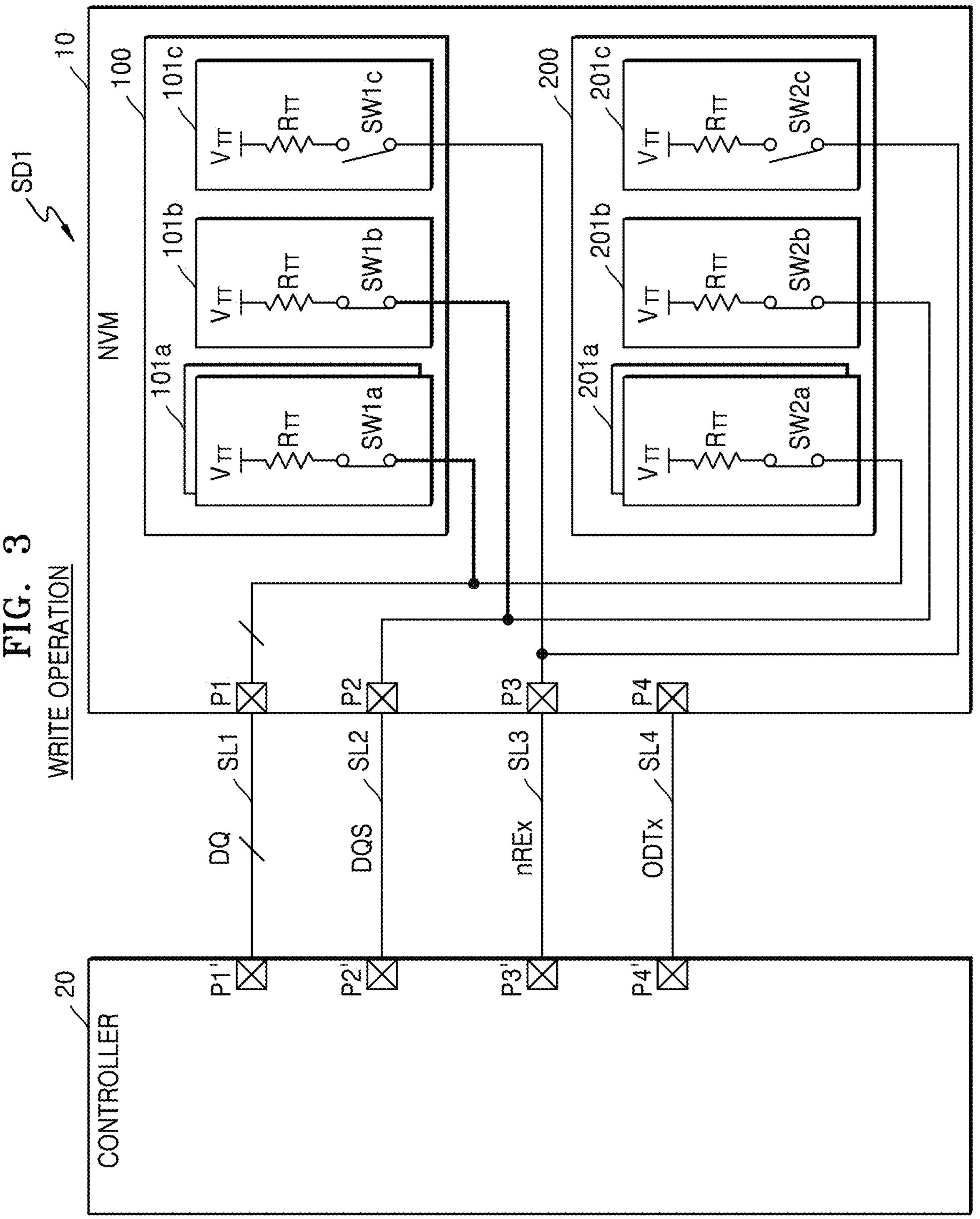
FIG. 3 shows connection of ODT circuits during a write operation of the storage device of FIG. 1
Figure 4:
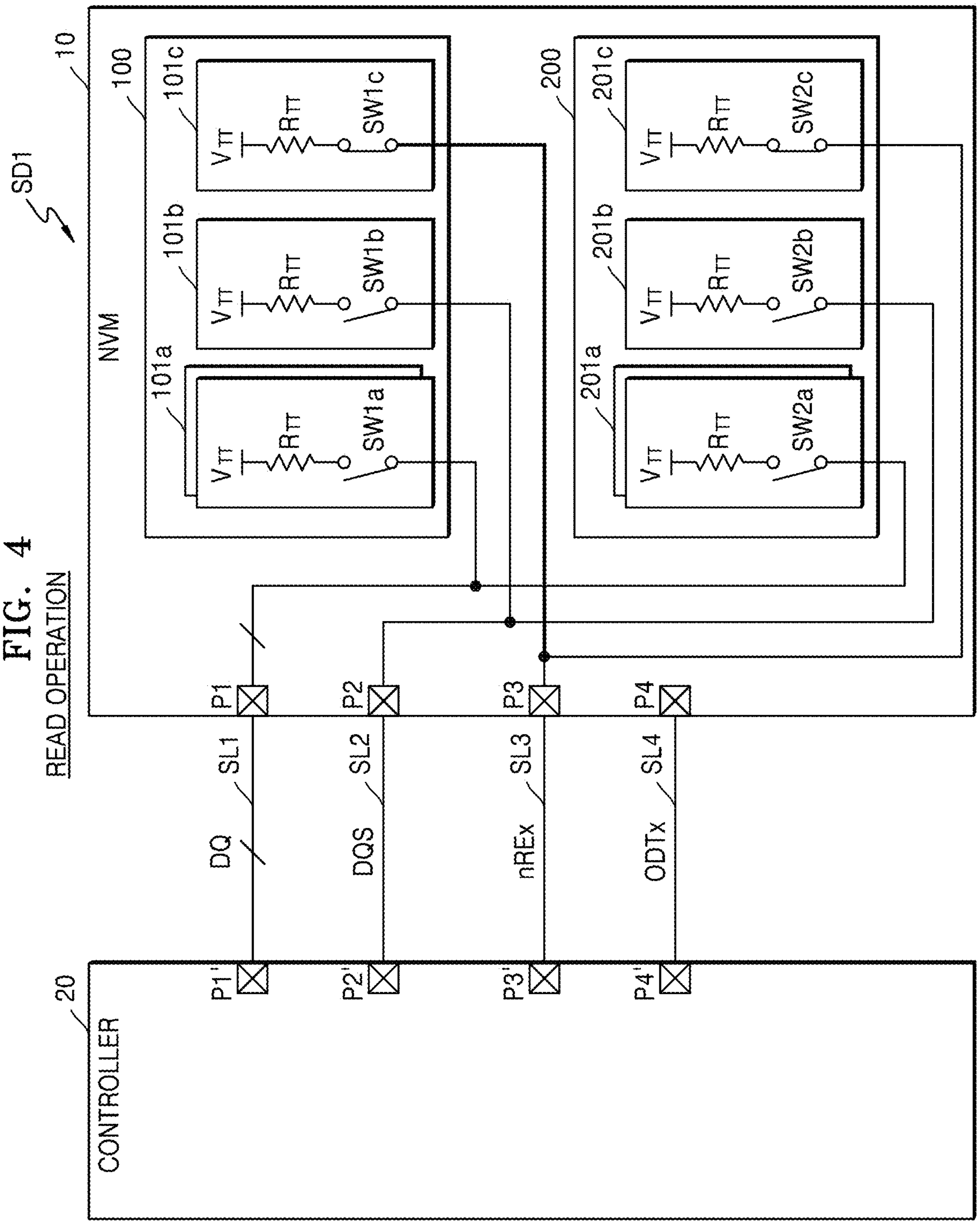
FIG. 4 shows connection of ODT circuits during a read operation of the storage device of FIG. 1.

FIG. 3 shows connection of ODT circuits 101*a*, 101*b*, 101*c*, 201*a*, 201*b*, and 201*c* during a write operation of the storage device SD1 of FIG. 1, and FIG. 4 shows connection of the ODT circuits 101*a*, 101*b*, 101*c*, 201*a*, 201*b*, and 201*c* during a read operation of the storage device SD1 of FIG. 1.

Referring to FIGS. 3 and 4, the first memory chip 100 includes the first ODT circuits 101*a* respectively connected to the first signal lines SL1, the second ODT circuit 101*b* connected to the second signal line SL2, and the third ODT circuit 101*c* connected to the third signal line SL3. The second memory chip 200 includes the first ODT circuits 201*a* respectively connected to the first signal lines SL1, the second ODT circuit 201*b* connected to the second signal line SL2, and the third ODT circuit 201*c* connected to the third signal line SL3. Here, the first through second ODT circuits 101*a* through 201*b* may be referred to as ODT circuits for writing, and the third ODT circuits 101*c* and 201*c* may be referred to as ODT circuits for reading.

The controller 20 generates a read enable signal nREx and the read enable signal nREx is transmitted to the NVM 10 via the third signal line SL3. The NVM 10 receives the read enable signal nREx via the third pin P3. For example, in order to enable a read operation with respect to one of the first and second memory chips 100 and 200, the read enable signal nREx is activated (e.g., set to a first logic level different from a second logic level used to represent a deactivated state). For example, in order to enable a write operation with respect to one of the first and second memory chips 100 and 200, the read enable signal nREx is inactivated (or deactivated).

Referring to FIG. 3, the second memory chip 200 is selected and the first memory chip 100 is non-selected for a write operation. For example, during the write operation, data will be written to the selected memory chip and not written to the non-selected memory chip. In an embodiment, the controller 20 generates chip enable signals with respect to the first and second memory chips 100 and 200, the read enable signal nREx, and an ODT signal ODTx. For example, the chip enable signal with respect to the first memory chip 100 is inactivated, the chip enable signal with respect to the second memory chip 200 is activated since the second memory chips 200 is the subject of the write, the read enable signal nREx is inactivated to indicate a write is to occur, and the ODT signal ODTx is activated.

The non-selected first memory chip 100 determines an operation performed with respect to the second memory chip 200 is a write operation, based on the read enable signal nREx, and thus determines an ODT mode as a write ODT mode. The non-selected first memory chip 100 enables the first and second ODT circuits 101*a* and 101*b* and disables the third ODT circuit 101*c*, based on the ODT signal ODTx and the read enable signal nREx. Accordingly, ODT switches SW1*a* included in the first ODT circuits 101*a*, respectively, are turned on, and the ODT resistors $R_{TT}$ are connected to the first signal lines SL1, respectively, so as to prohibit the data signals DQ transmitted via the first signal lines SL1, respectively, from being reflected. Also, an ODT switch SW1*b* included in the second ODT circuit 101*b* may be turned on and the ODT resistor $R_{TT}$ may be connected to the second signal line SL2 so as to prohibit the data strobe signal DQS transmitted via the second signal line SL2 from being reflected. If the first memory chip 100 is instead the subject of the write (e.g., selected) and the second memory chip 200 is not selected, the selected second memory chip 200 enables the first and second ODT circuits 201*a* and 201*b* and disables the third ODT circuit 201*c* based on the ODT signal ODTx and the read enable signal nREx.

Referring to FIG. 4, the second memory chip 200 is selected and the first memory chip 100 is non-selected for a read operation. In an embodiment, the controller 20 generates chip enable signals with respect to the first and second memory chips 100 and 200, the read enable signal nREx, and the ODT signal ODTx. For example, the chip enable signal with respect to the first memory chip 100 is inactivated, the chip enable signal with respect to the second memory chip 200 is activated, and both of the read enable signal nREx and the ODT signal ODTx are activated.

The non-selected first memory chip 100 determines an operation performed with respect to the second memory chip 200 is a read operation based on the read enable signal nREx, and thus determines an ODT mode is a read ODT mode. The non-selected first memory chip 100 disables the first and second ODT circuits 101*a* and 101*b* and enables the third ODT circuit 101*c* based on the ODT signal ODTx and the read enable signal nREx. Accordingly, an ODT switch SW1*c* included in the third ODT circuit 101*c* is turned on (e.g., closed) and the ODT resistor $R_{TT}$ is connected to the third signal line SL3 so as to prohibit the read enable signal nREx transmitted via the third signal line SL3 from being reflected. If the first memory chip 100 is instead the subject of the read (e.g., selected) and the second memory chip 200 is not selected, the selected second memory chip 200 disables the first and second ODT circuits 201*a* and 201*b* and enables the third ODT circuit 201*c* based on the ODT signal ODTx and the read enable signal nREx.

Figure 5:
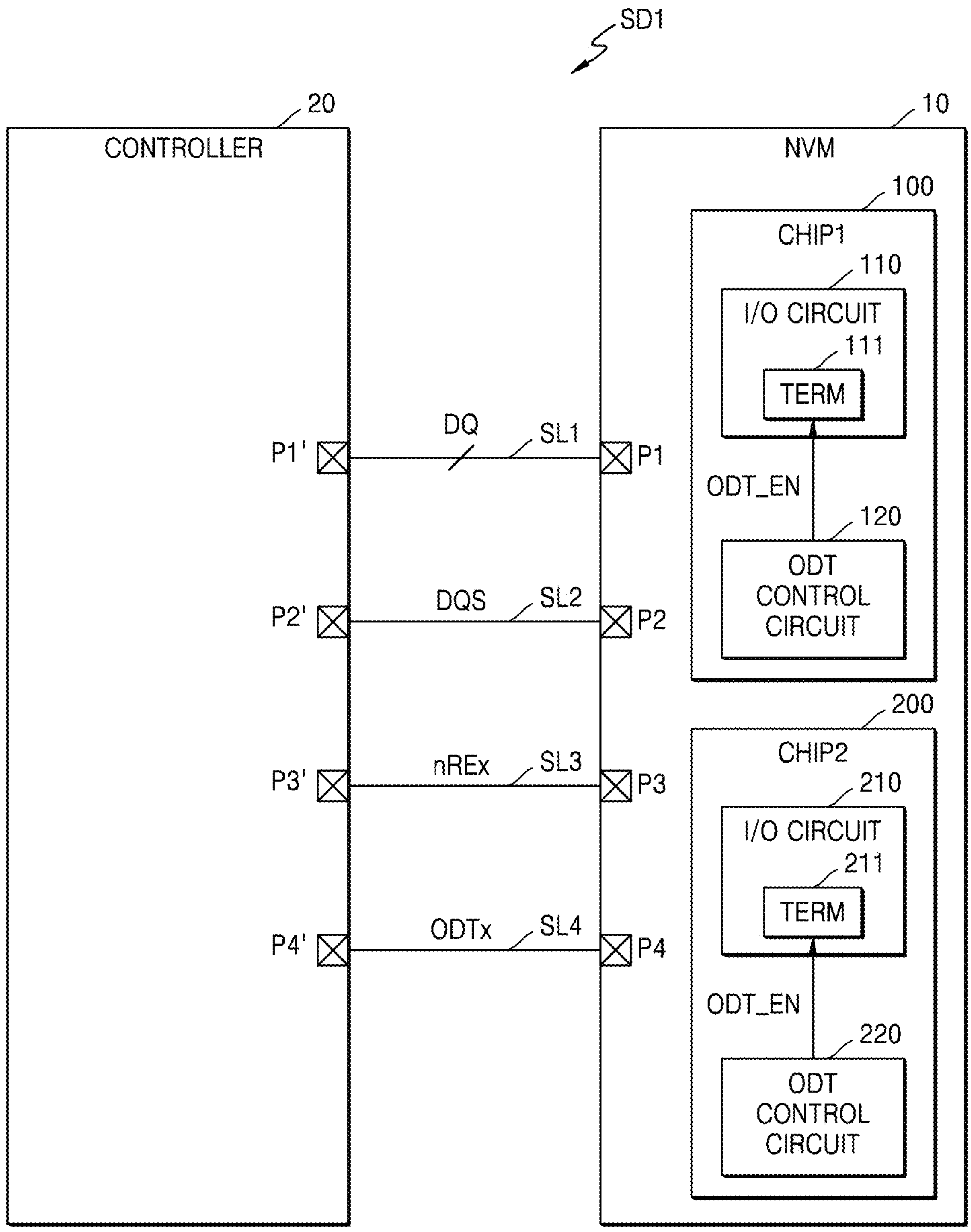
FIG. 5 is a block diagram showing in more detail the storage device of FIG. 1, according to an exemplary embodiment of the inventive concept.

FIG. 5 is a block diagram showing in more detail the storage device SD1 of FIG. 1 according to an exemplary embodiment of the inventive concept.

Referring to FIG. 5, the first memory chip 100 includes an input and output (I/O) circuit 110 and an ODT control circuit 120, and the input and output circuit 110 includes an ODT circuit 111. The second memory chip 200 includes an input and output circuit 210 and an ODT control circuit 220, and the input and output circuit 210 includes an ODT circuit 211. Hereinafter, descriptions will be given by focusing on the first memory chip 100, and the descriptions with respect to the first memory chip 100 may be applied to the second memory chip 200.

The input and output circuit 110 may be connected to the first and second signal lines SL1 and SL2, and include the ODT circuit 111. The ODT control circuit 120 generates an ODT control signal ODT_EN to control the ODT circuit 111, based on the ODT signal ODTx and the read enable signal nREx. According to an embodiment, when the ODT signal ODTx is activated, the ODT control circuit 120 detects a logic level of the read enable signal nREx and generates the ODT control signal ODT_EN based on the detected logic level. In an exemplary embodiment, when the ODT control signal ODT_EN is activated, the ODT circuit 111 is connected to the first and second signal lines SL1 and SL2, and when the ODT control signal ODT_EN is inactivated, the ODT circuit 111 is disconnected from the first and second signal lines SL1 and SL2. In an exemplary embodiment, when the ODT control signal ODT_EN is activated and the read enable signal nREx is inactivated, the ODT circuit 111 is connected to the first and second signal lines SL1 and SL2, and when the ODT control signal ODT_EN is inactivated, the ODT circuit 111 is disconnected from the first and second signal line SL1 and SL2. In an exemplary embodiment, when the ODT control signal ODT_EN is activated and the read enable signal nREx is activated, the ODT circuit 111 is connected to the third signal line SL3, and when the ODT control signal ODT_EN is inactivated, the ODT circuit 111 is disconnected from the third signal line SL3.

Figure 6:
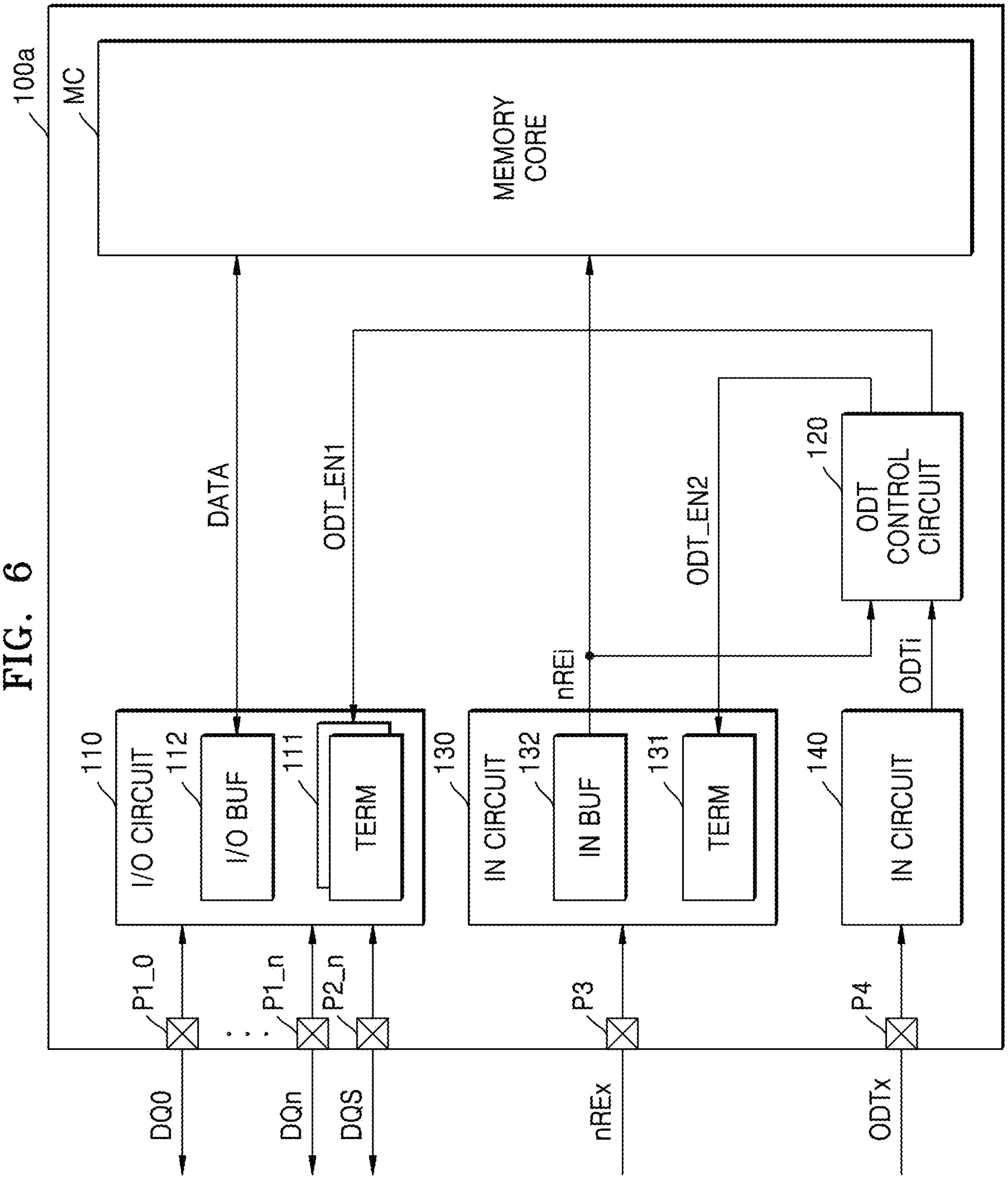
FIG. 6 is a block diagram showing in detail a first memory chip according to an exemplary embodiment of the inventive concept.

FIG. 6 is a block diagram showing in detail a first memory chip 100*a* according to an exemplary embodiment of the inventive concept. For example, the first memory chip 100*a* may correspond to an example of the first memory chip 100 of FIG. 5. However, structures of the first memory chip 100*a* are not limited to the structure of the first memory chip 100 of FIG. 5, and may be applied to the second memory chip 200.

Referring to FIG. 6, the first memory chip 100*a* includes the input and output circuit 110, the ODT control circuit 120, and first and second input circuits 130 and 140. Also, the first memory chip 100*a* may further include a memory core MC. The memory core MC may include a memory cell array, a row decoder, a page buffer, a voltage generator, etc., and may be referred to as a data path. The second memory chip 200 may be implemented substantially the same as the first memory chip 100*a*.

The input and output circuit 110 include the ODT circuits 111 and an input and output buffer 112. The input and output circuit 110 may transmit and receive a plurality of data signals DQ0 through DQn via a plurality of first pins P1_0 through P1_*n*, and transmit and receive the data strobe signal DQS via the second pin P2. Here, n is a positive integer, for example, 7. The input and output buffer 112 may output data to the memory core MC or receive data from the memory core MC. For example, the ODT circuits 111 may include the first and second ODT circuits 101*a* and 101*b* of FIGS. 3 and 4.

The first input circuit 130 receives the read enable signal nREx via the third pin P3. The first input circuit 130 includes an ODT circuit 131 and an input buffer 132. The input buffer 132 receives the read enable signal nREx, and outputs an internal read enable signal nREi by buffering the received read enable signal nREx. The ODT circuit 131 may include the third ODT circuit 101*c* of FIGS. 3 and 4.

The second input circuit 140 receives the ODT signal ODTx via the fourth pin P4, and outputs an internal ODT signal ODTi from the received ODT signal ODTx. For example, the second input circuit 140 may include an input buffer and the input buffer may output the internal ODT signal ODTi by buffering the ODT signal ODTx.

In an embodiment, the ODT control circuit 120 determines an ODT mode based on the internal ODT signal ODTi and the internal read enable signal nREi, and generates first and second ODT control signals ODT_EN1 and ODT_EN2 to control the ODT circuits 111 and 131, respectively, based on the determined ODT mode. For example, when the determined ODT mode is a write ODT mode, the first ODT control signal ODT_EN1 has an enable level (e.g., logic "high"). For example, when the determined ODT mode is a read ODT mode, the second ODT control signal ODT_EN2 has an enable level (e.g., logic "high"). According to the present embodiment, the first memory chip 100*a* controls the ODT circuits 111 and 131 based on operations of the second input circuit 140, the ODT control circuit 120 and the input buffer 132, and thus, current consumption used for the ODT control operation may be reduced.

Figure 7A:
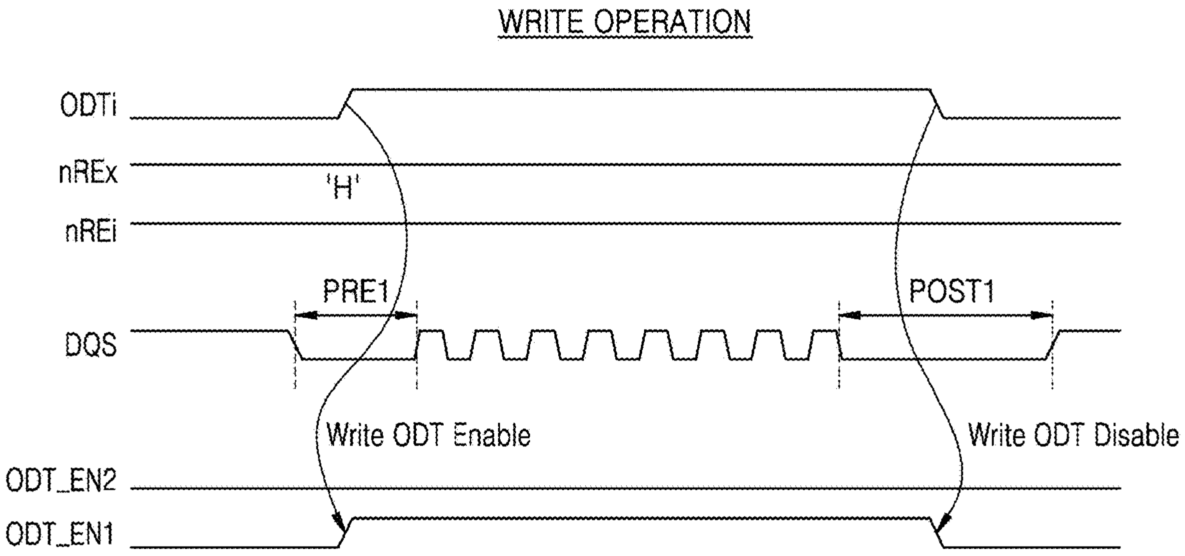
FIG. 7A is a timing view of a write operation according to an embodiment and FIG. 7B is a timing view of a read operation according to an embodiment.
Figure 7B:
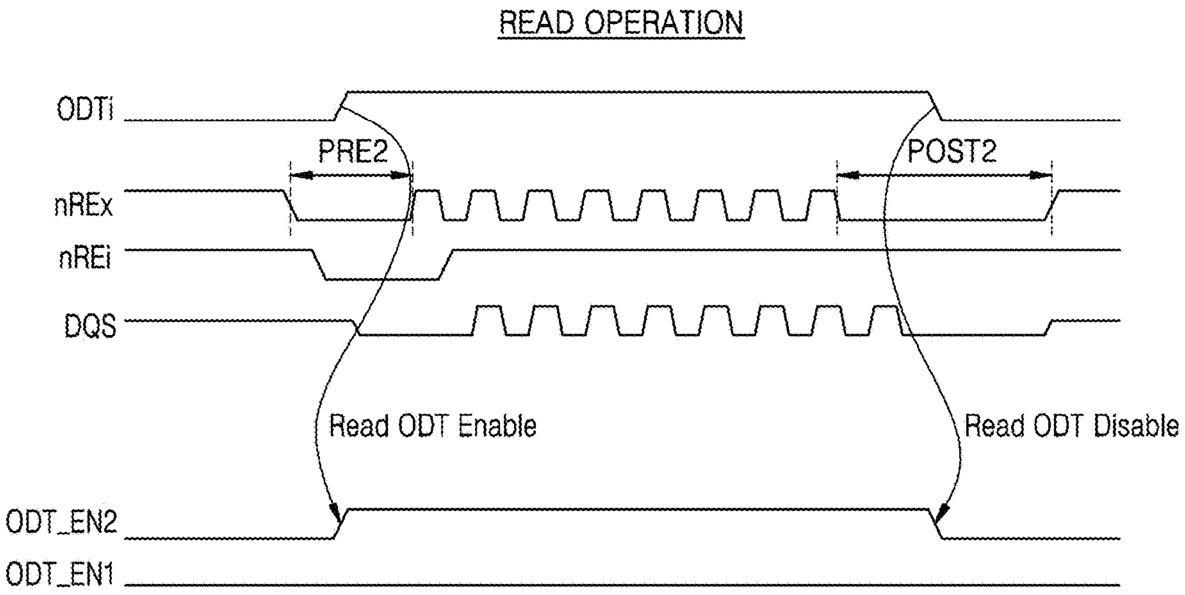

FIG. 7A is a timing diagram of a write operation according to an embodiment and FIG. 7B is a timing diagram of a read operation according to an embodiment.

Referring to FIGS. 6 and 7A, the read enable signal nREx is logic "high" (e.g., a write is occurring) and thus, the internal read enable signal nREi is logic "high". The internal ODT signal ODTi is activated to an enable level, for example, a logic "high" in a preamble section PRE1 of the data strobe signal DQS, and is inactivated to a disable level, for example, a logic "low" in a post-amble section POST1 of the data strobe signal DQS. Here, the preamble section PRE1 of the data strobe signal DQS is a logic "low" section before a toggling section of the data strobe signal DQS, and the post-amble section POST1 of the data strobe signal DQS is a logic "low" section after the toggling section of the data strobe signal DQS. In an embodiment, the ODT signal ODTi is enabled within the preamble section PRE1 while an address latch enable signal, a command latch enable signal, and the data strobe signal DQS are logic "low".

The ODT control circuit 120 detects a logic level of the internal read enable signal nREi at the activation point of the internal ODT signal ODTi, that is, when a level of the internal ODT signal ODTi is enabled. For example, the activation point of the internal ODT signal ODTi may correspond to a rising edge of the internal ODT signal ODTi. However, the present inventive concept is not limited thereto. In an alternate embodiment, the activation point of the internal ODT signal ODTi corresponds to a falling edge of the internal ODT signal ODTi. In the alternate embodiment, the ODT control circuit 120 is designed to detect the logic level of the internal read enable signal nREi at the falling edge of the internal ODT signal ODTi. In an exemplary embodiment, when the detected logic level of the internal read enable signal nREi is "high," the ODT control circuit 120 determines the ODT mode is the write ODT mode, and activates the first ODT control signal ODT_EN1 based on the determined write ODT mode. Thus, the ODT circuits 111 included in the input and output circuit 110 are enabled.

Next, the ODT control circuit 120 inactivates the first ODT control signal ODT_EN1 at the inactivation point of the internal ODT signal ODTi, that is, when a level of the internal ODT signal ODTi is disabled (e.g., at a falling edge). Accordingly, the ODT circuits 111 included in the input and output circuit 110 are disabled. According to an embodiment, the ODT control circuit 120 detects the logic level of the internal read enable signal nREi at the falling edge of the internal ODT signal ODTi, and when the detected logic level is "high", determines that the write operation of the selected second memory chip 200 has completed and inactivates the first ODT control signal ODT_EN1.

Referring to FIGS. 6 and 7B, the internal ODT signal ODTi is activated to a logic "high" in a preamble section PRE2 of the read enable signal nREx, and inactivated to a logic "low" in a post-amble section POST2 of the read enable signal nREx. Here, the preamble section PRE2 of the read enable signal nREx is a logic "low" section before a toggling section of the read enable signal nREx and the post-amble section POST2 of the read enable signal nREx is a logic "low" section after the toggling section of the read enable signal nREx. In an exemplary embodiment, the ODT signal ODTi is activated within the preamble section PRE2 after the read enable signal nREx falls. The internal read enable signal nREi transitions to a logic "low" in the preamble section PRE2 of the read enable signal nREx and maintains a logic "high" after the toggling section of the read enable signal nREx.

The ODT control circuit 120 detects a logic level of the internal read enable signal nREi at the activation point of the internal ODT signal ODTi, for example, at a rising edge of the internal ODT signal ODTi. In an exemplary embodiment, when the detected logic level of the internal read enable signal nREi is "low" the ODT control circuit 120 determines an ODT mode is a read ODT mode and activates the second ODT control signal ODT_EN2 based on the determined read ODT mode. Accordingly, the ODT circuit 131 included in the first input circuit 130 is enabled.

Next, the ODT control circuit 120 inactivates the second ODT control signal ODT_EN2 at an inactivation point of the internal ODT signal ODTi, for example, at a falling edge of the internal ODT signal ODTi. Accordingly, the ODT circuit 131 included in the first input circuit 130 is disabled. According to an embodiment, the ODT control circuit 120 detects a logic level of the internal read enable signal nREi at the falling edge of the internal ODT signal ODTi, and when the detected logic level is "low," determines that the read operation of the selected second memory chip 200 has completed and inactivates the second ODT control signal ODT_EN2.

Figure 8:
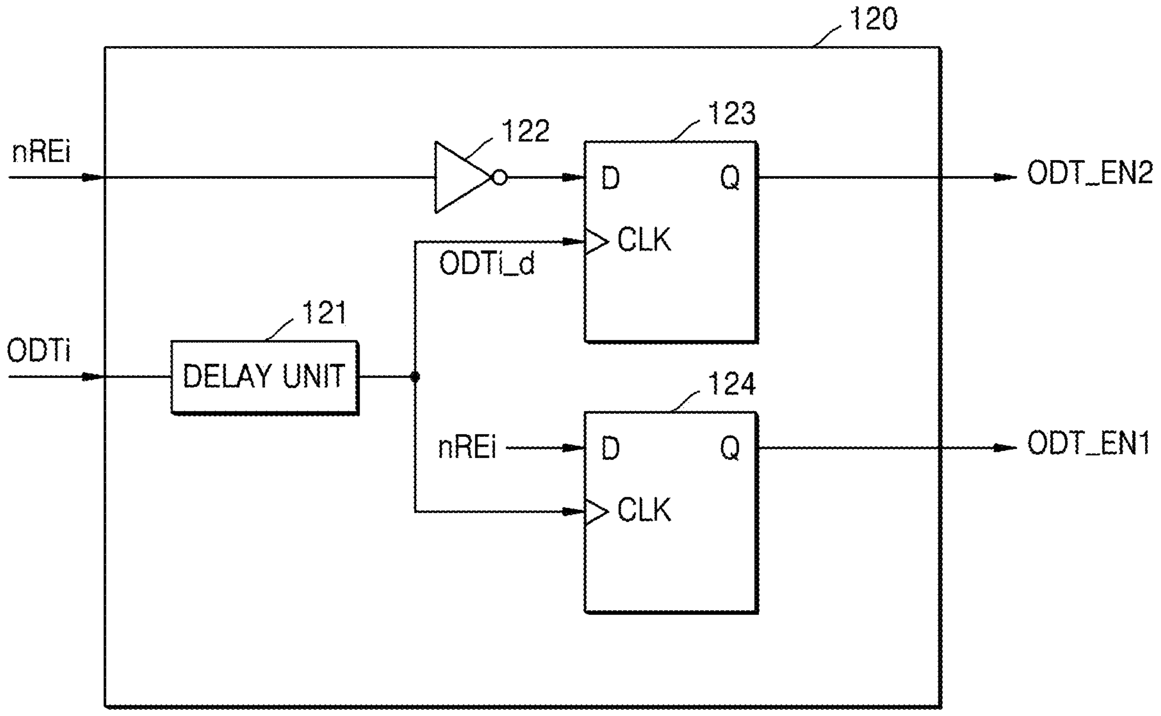
FIG. 8 is a block diagram showing in detail an ODT control circuit of FIG. 5 according to an exemplary embodiment of the inventive concept.

FIG. 8 is a block diagram showing in detail the ODT control circuit 120 of FIG. 5 according to an exemplary embodiment of the inventive concept.

Referring to FIG. 8, the ODT control circuit 120 includes a delay unit 121 (e.g., a delay circuit), an inverter 122, first and second flip-flops 123 and 124. The delay unit 121 receives the internal ODT signal ODTi and delays the received internal ODT signal ODTi for a predetermined period of time to output a delayed internal ODT signal ODTi_d. The delayed internal ODT signal ODTi_d is applied to a clock terminal CLK of the first and second flip-flops 123 and 124.

An output of the inverter 122, that is, an inverted signal of the internal read enable signal nREi, is applied to an input terminal D of the first flip-flop 123, and the second ODT control signal ODT_EN2 is output from an output terminal Q of the first flip-flop 123. The internal read enable signal nREi is applied to an input terminal D of the second flip-flop 124 and the first ODT control signal ODT_EN1 is output from an output terminal Q of the second flip-flop 124.

For example, as illustrated in FIG. 7A, when the logic level of the internal read enable signal nREi is "high" at a point in which the delayed internal ODT signal ODTi_d is activated, the first ODT control signal ODT_EN1 is activated. For example, at the point in which the delayed internal ODT signal ODTi_d is activated, when the logic level of the internal read enable signal nREi is "low" as illustrated in FIG. 7B, the second ODT control signal ODT_EN2 is activated.

Figure 9:
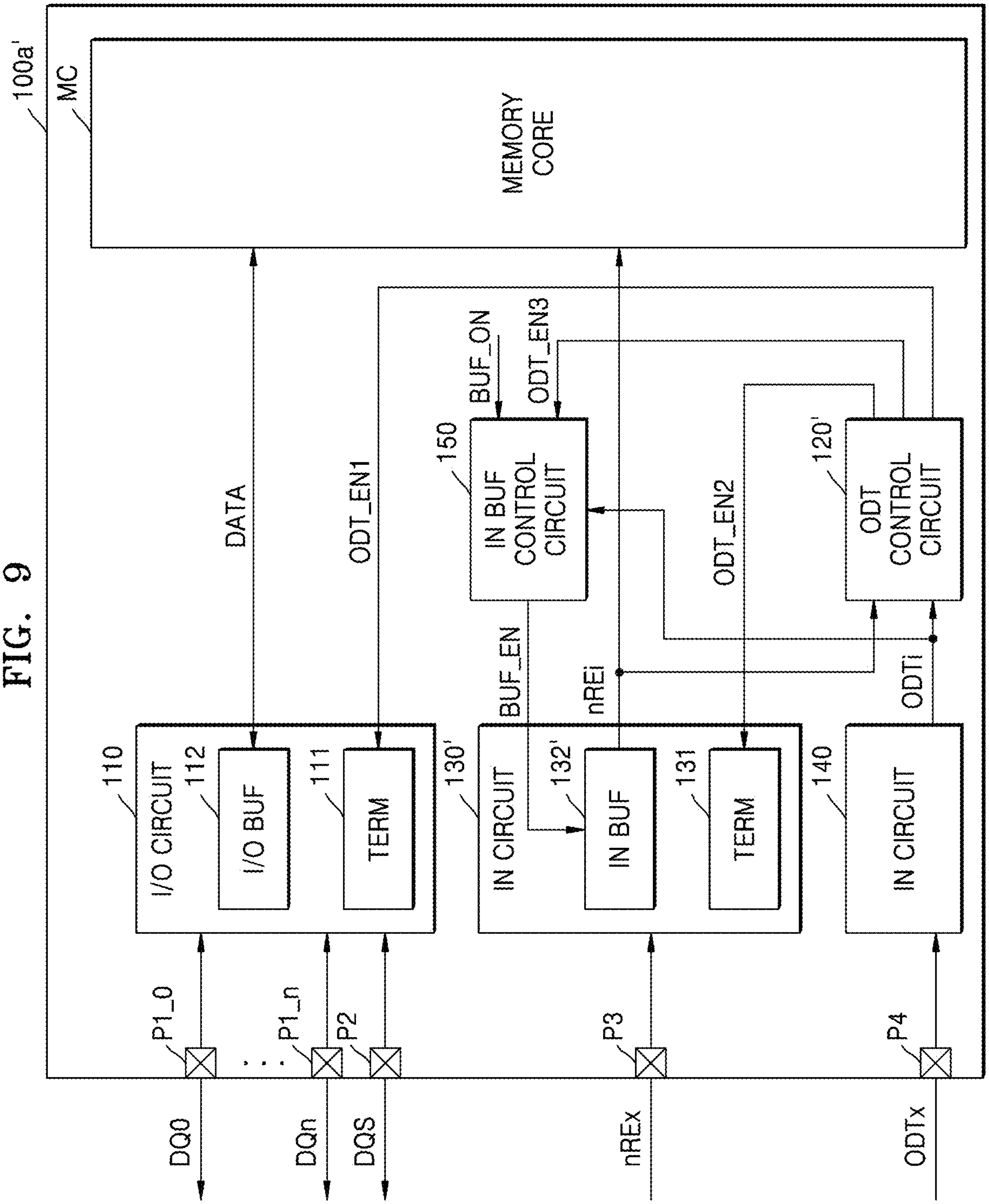
FIG. 9 is a block diagram showing in detail a first memory chip according to an exemplary embodiment of the inventive concept.

FIG. 9 is a block diagram showing in detail a first memory chip 100*a*' according to an exemplary embodiment of the inventive concept. For example, the first memory chip 100*a*' may correspond to a modified example of the first memory chip 100*a* of FIG. 6.

Referring to FIG. 9, the first memory chip 100*a*' includes the input and output circuit 110, an ODT control circuit 120', first and second input circuits 130' and 140, an input buffer control circuit 150, and the memory core MC. The ODT control circuit 120' determines an ODT mode based on the internal ODT signal ODTi and the internal read enable signal nREi, and generates the first and second ODT control signals ODT_EN1 and ODT_EN2 based on the determined ODT mode. Also, the ODT control circuit 120' generates a third ODT control signal ODT_EN3 based on the first and second ODT control signals ODT_EN1 and ODT_EN2. For example, when the first or the second ODT control signal ODT_EN1 or ODT_EN2 is activated, the third ODT control signal ODT_EN3 is activated.

When the internal ODT signal ODTi is activated, the ODT control circuit 120' detects a logic level of the internal read enable signal nREi in order to determine the ODT mode. In an exemplary embodiment, when the internal ODT signal ODTi is activated, the input buffer control circuit 150 activates an input buffer control signal BUF_EN in order to enable an input buffer 132'. Here, the detected logic level of the internal read enable signal nREi may be latched.

Meanwhile, after the ODT control circuit 120' determines the ODT mode and activates the first or second ODT control signal ODT_EN1 or ODT_EN2 based on the determined ODT mode, the ODT control circuit 120' no longer needs to detect the logic level of the internal read enable signal nREi. Thus, when the first or second ODT control signal ODT_EN1 or ODT_EN2 is activated, the input buffer control circuit 150 may inactivate the input buffer control signal BUF_EN so as to disable the input buffer 132'. Accordingly, power consumption of the input buffer 132' may be reduced.

In an exemplary embodiment, the input buffer control circuit 150 generates the input buffer control signal BUF_EN for controlling the input buffer 132', based on a buffer on signal BUF_ON, the internal ODT signal ODTi, and the third ODT control signal ODT_EN3. According to an embodiment, when the buffer on signal BUF_ON is activated, the input buffer control circuit 150 activates the input buffer control signal BUF_EN, and the input buffer 132' is enabled. For example, the buffer on signal BUF_ON may be generated by control logic based on control signals, such as a chip selection signal and a write mode signal. According to an embodiment, when the internal ODT signal ODTi is activated and the third ODT control signal ODT_EN3 is inactivated, the input buffer control circuit 150 activates the input buffer control signal BUF_EN, and the input buffer 132' is enabled. Meanwhile, when the internal ODT signal ODTi and the third ODT control signal ODT_EN3 are activated, the input buffer control circuit 150 inactivates the input buffer control signal BUF_EN, and the input buffer 132' may is disabled. In an exemplary embodiment, the ODT control circuit 120' may activate the input buffer 132' when the ODT signal ODTi is activated, and may inactivate the input buffer 132' after a pre-defined delay.

Figure 10A:
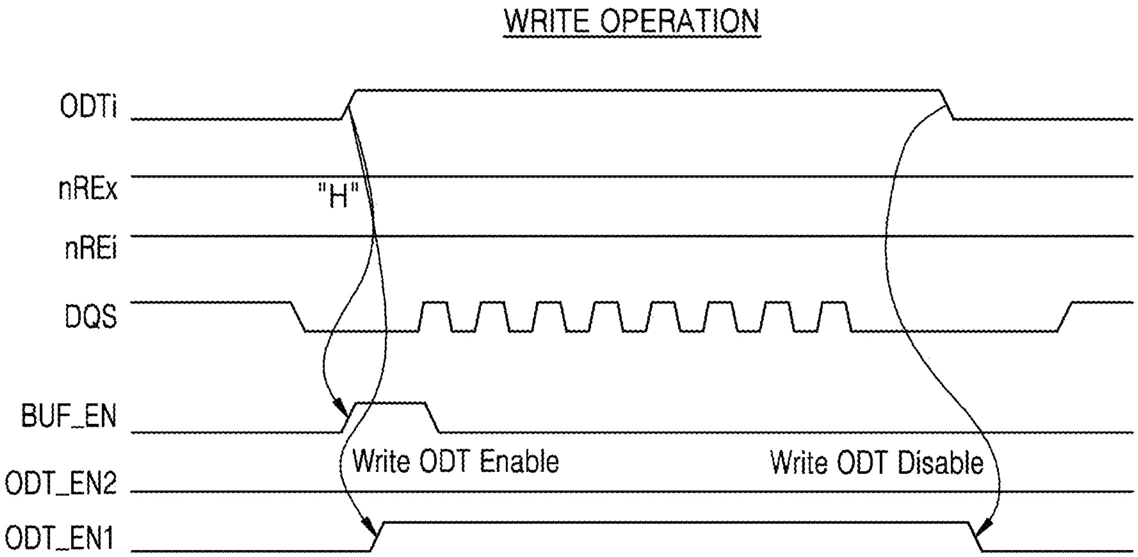
FIG. 10A is a timing view of a write operation according to an embodiment and FIG. 10B is a timing view of a read operation according to an embodiment.
Figure 10B:
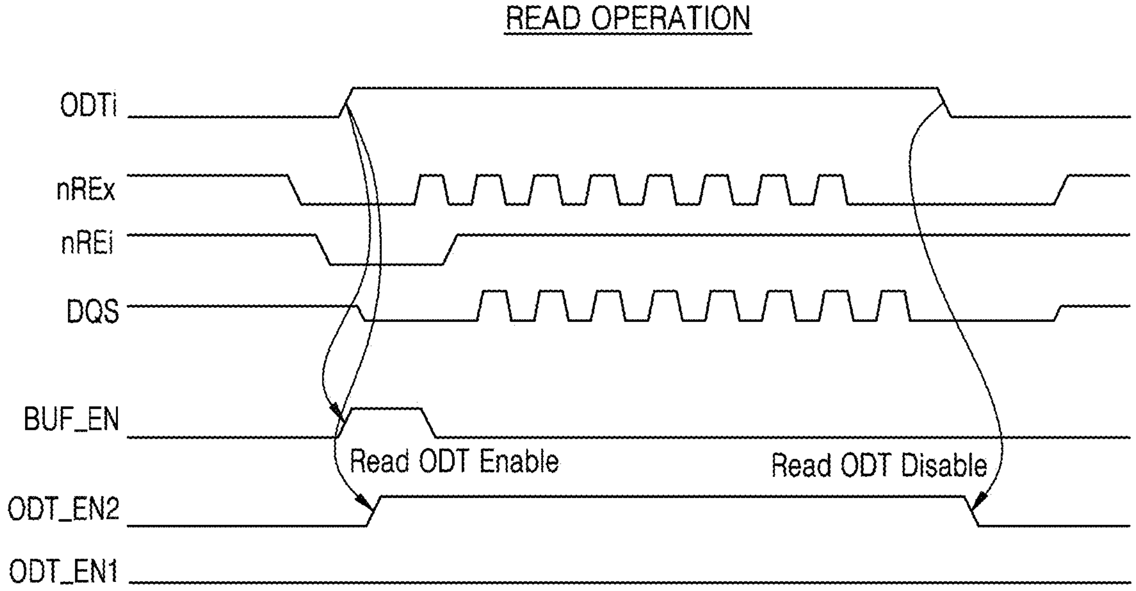

FIG. 10A is a timing view of a write operation according to an embodiment and FIG. 10B is a timing view of a read operation according to an embodiment.

Referring to FIGS. 9 and 10A, the input buffer control circuit 150 activates the input buffer control signal BUF_EN for only a section of a short period after the internal ODT signal ODTi transitions to an enable level, for example, logic "high." Accordingly, the input buffer 132' is enabled to output the internal read enable signal nREi, and the ODT control circuit 120' detects a logic "high" level of the internal read enable signal nREi, so as to determine the ODT mode as the write ODT mode. After the ODT mode is determined, the input buffer control circuit 150 inactivates the input buffer control signal BUF_EN and the internal read enable signal nREi may be latched.

The ODT control circuit 120' activates the first ODT control signal ODT_EN1 based on the determined ODT mode, and the ODT circuits 111 are enabled based on the activated first ODT control signal ODT_EN1. Thus, the ODT circuits 111 are respectively connected to signal lines via which the plurality of data signals DQ0 through DQn and the data strobe signal DQS are transmitted via the first through second pins P1_0, . . . , P1_*n*, P2. Next, when the internal ODT signal ODTi is inactivated, the ODT control circuit 120' inactivates the first ODT control signal ODT_EN1 to disable the ODT circuits 111.

Referring to FIGS. 9 and 10B, the input buffer control circuit 150 activates the input buffer control signal BUF_EN for only a section of a short period after the internal ODT signal ODTi transitions to an enable level, for example, a logic "high." Accordingly, the input buffer 132' is enabled to output the internal read enable signal nREi, and the ODT control circuit 120' detects a logic "low" level of the internal read enable signal nREi so as to determine the ODT mode as the read ODT mode. After the ODT mode is determined, the input buffer control circuit 150 inactivates the input buffer control signal BUF_EN and the internal read enable signal nREi may be latched.

The ODT control circuit 120' activates the second ODT control signal ODT_EN2 based on the determined ODT mode, and the ODT circuits 131 are enabled based on the activated second ODT control signal ODT_EN2. Thus, the ODT circuits 131 are connected to a signal line, via which the read enable signal nREx is transmitted via the third pin P3. Next, when the internal ODT signal ODTi is inactivated, the ODT control circuit 120' inactivates the second ODT control signal ODT_EN2, to disable the ODT circuit 131. Here, the internal read enable signal nREi may be re-set.

Figure 11:
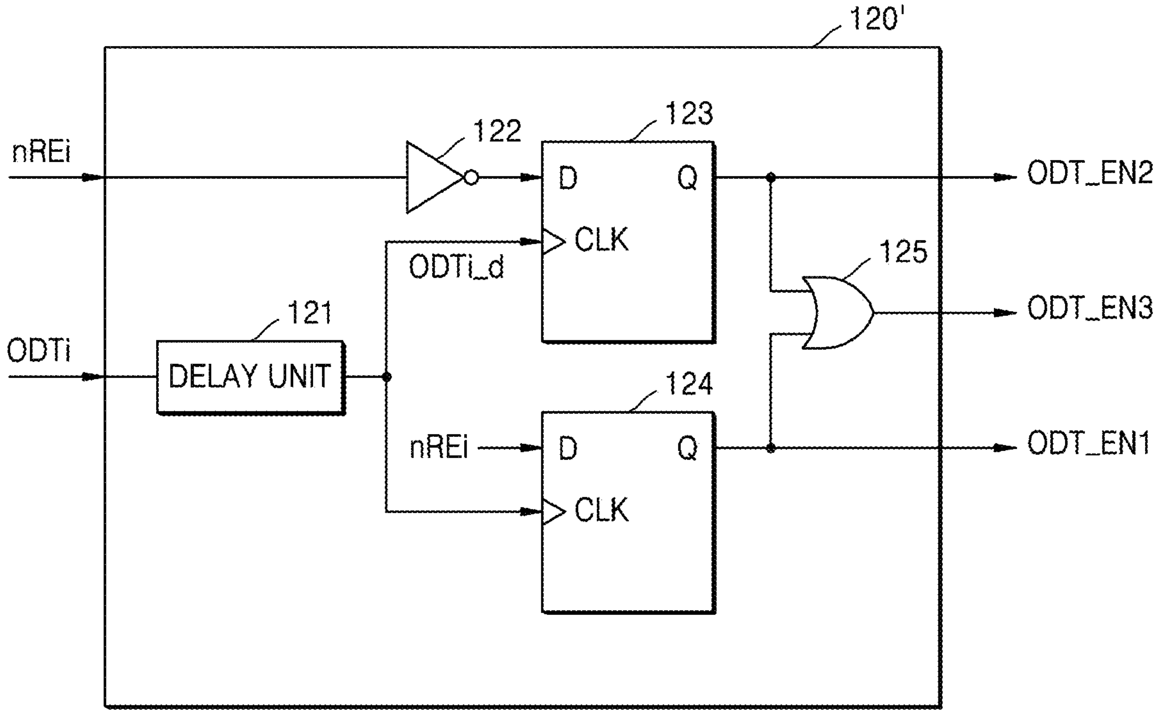
FIG. 11 is a block diagram showing in detail an ODT control circuit of FIG. 9 according to an exemplary embodiment of the inventive concept.

FIG. 11 is a block diagram showing in detail the ODT control circuit 120' of FIG. 9 according to an exemplary embodiment of the inventive concept.

Referring to FIG. 11, the ODT control circuit 120' includes the delay unit 121, the inverter 122, the first and second flip-flops 123 and 124, and a logic gate 125. Unlike the ODT control circuit 120 of FIG. 8, the ODT control circuit 120' according to the present embodiment further includes the logic gate 125, and the aspects described with reference to FIG. 8 may be applied to the present embodiment. The logic gate 125 may perform a logic operation with respect to the first and second ODT control signals ODT_EN1 and ODT_EN2 to output the third ODT control signal ODT_EN3. For example, the logic gate 125 may be an OR gate performing an OR operation with respect to the first and second ODT control signals ODT_EN1 and ODT_EN2. Accordingly, when one of the first and second ODT control signals ODT_EN1 and ODT_EN2 is activated, the third ODT control signal ODT_EN3 is activated. When both the first and second ODT control signals ODT_EN1 and ODT_EN2 are inactivated, the third ODT control signal ODT_EN3 is inactivated.

Figure 12:
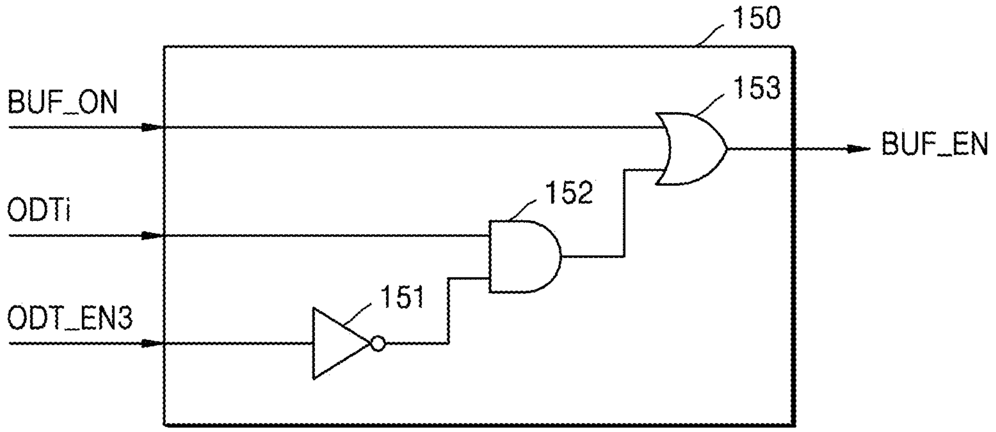
FIG. 12 is a block diagram showing in detail an input buffer control circuit of FIG. 9 according to an exemplary embodiment of the inventive concept.

FIG. 12 is a block diagram showing in detail the input buffer control circuit 150 of FIG. 9 according to an exemplary embodiment of the inventive concept.

Referring to FIG. 12, the input buffer control circuit 150 includes an inverter 151, and first and second logic gates 152 and 153. The inverter 151 inverts the third ODT control signal ODT_EN3. The first logic gate 152 (e.g., an AND gate) performs an AND operation with respect to the internal ODT signal ODTi and an output of the inverter 151. The second logic gate 153 (e.g., an OR gate) performs an OR operation with respect to the buffer on signal BUF_ON and an output of the first logic gate 152 in order to generate the input buffer control signal BUF_EN.

For example, when the first memory chip 100*a'* is the non-selected memory chip, the first memory chip 100*a'* is in a stand-by state, and thus, the input buffer 132' is disabled. Here, when the internal ODT signal ODTi is activated, the buffer on signal BUF_ON is activated, and thus, the input buffer control signal BUF_EN is activated. The input buffer 132' is enabled based on the activated input buffer control signal BUF_EN.

For example, when the third ODT control signal ODT_EN3 is activated, the output of the inverter 151 is logic "low" and the output of the first logic gate 152 is always logic "low." Here, when the buffer on signal BUF_ON is a logic "low" the buffer control signal BUF_EN, which is the output of the second logic gate 153, may be inactivated, in order to disable the input buffer 132'. Thus, currents applied to the input buffer 132' may be reduced.

For example, when the third ODT control signal ODT_EN3 is inactivated, the output of the inverter 151 is logic "high." Here, when the internal ODT signal ODTi is logic "high" the output of the first logic gate 152 may be logic "high" and the buffer control signal BUF_EN, which is the output of the second logic gate 153, may be activated, in order to enable the input buffer 132'. Meanwhile, when the internal ODT signal ODTi is logic "low," the output of the first logic gate 152 may be logic "low" and when the buffer on signal BUF_ON is logic "low," the buffer control signal BUF_EN, which is the output of the second logic gate 153, may be inactivated, in order to disable the input buffer 132'.

Figure 13:
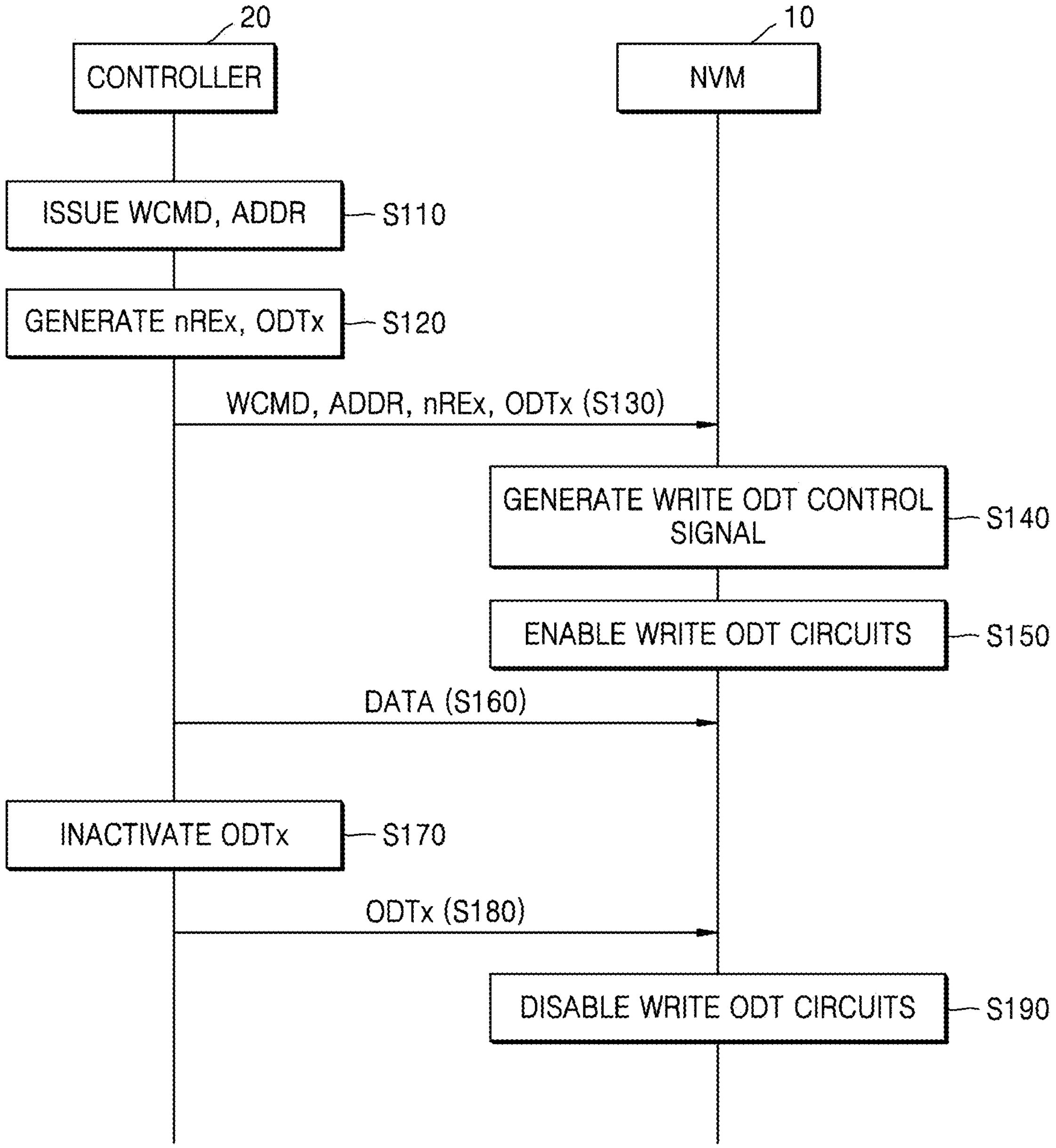
FIG. 13 is a flowchart of a write operation between a nonvolatile memory and a controller, according to an embodiment.

FIG. 13 is a flowchart of a write operation between the NVM 10 and the controller 20, according to an exemplary embodiment of the inventive concept. For example, the NVM 10 and the controller 20 may correspond to the NVM 10 and the controller 20 of FIG. 3.

In operation S110, the controller 20 generates a write command WCMD and an address ADDR. In operation S120, the controller 20 generates a read enable signal nREx and an ODT signal ODTx. According to an embodiment, operations S110 and S120 are substantially simultaneously performed. In operation S130, the controller 20 transmits the write command WCMD, the address ADDR, the read enable signal nREx, and the ODT signal ODTx to the NVM 10. For example, the write command WCMD and the address ADDR may be transmitted to the NVM 10 from the controller 20 via the first signal lines SL1, and the read enable signal nREx and the ODT signal ODTx may be transmitted to the NVM 10 from the controller 20 via the third and fourth signal lines SL3 and SL4, respectively.

In operation S140, the NVM 10 determines the ODT mode as a write ODT mode based on the read enable signal nREx and the ODT signal ODTx, and generates a write ODT control signal. For example, the first and second memory chips 100 and 200 included in the NVM 10 may determine the ODT mode as the write ODT mode based on the read enable signal nREx and the ODT signal ODTx, and may generate the write ODT control signal. In operation S150, the NVM 10 enables the write ODT circuits. For example, the first memory chip 100 included in the NVM 10 may enable the write ODT circuits 101*a* and 101*b* and the second memory chip 200 included in the NVM 10 may enable the write ODT circuits 201*a* and 201*b*. In operation S160, the controller 20 transmits data for writing to the NVM 10. For example, the data signals DQ and the data strobe signal DQS may be transmitted to the NVM 10 from the controller 20 via the first and second signal lines SL1 and SL2, respectively. In an exemplary embodiment, operation S150 is performed after operation S160.

In operation S170, the controller 20 inactivates the ODT signal ODTx and in operation S180, the controller 20 transmits the inactivated ODT signal ODTx to the NVM 10. In operation S190, the NVM 10 disables the write ODT circuits based on the inactivated ODT signal ODTx. For example, the first memory chip 100 included in the non-volatile memory 10 may disable the write ODT circuits 101*a* and 101*b* based on the inactivated ODT signal ODTx, and the second memory chip 200 included in the NVM 10 may disable the write ODT circuits 201*a* and 201*b* based on the inactivated ODT signal ODTx.

Figure 14:
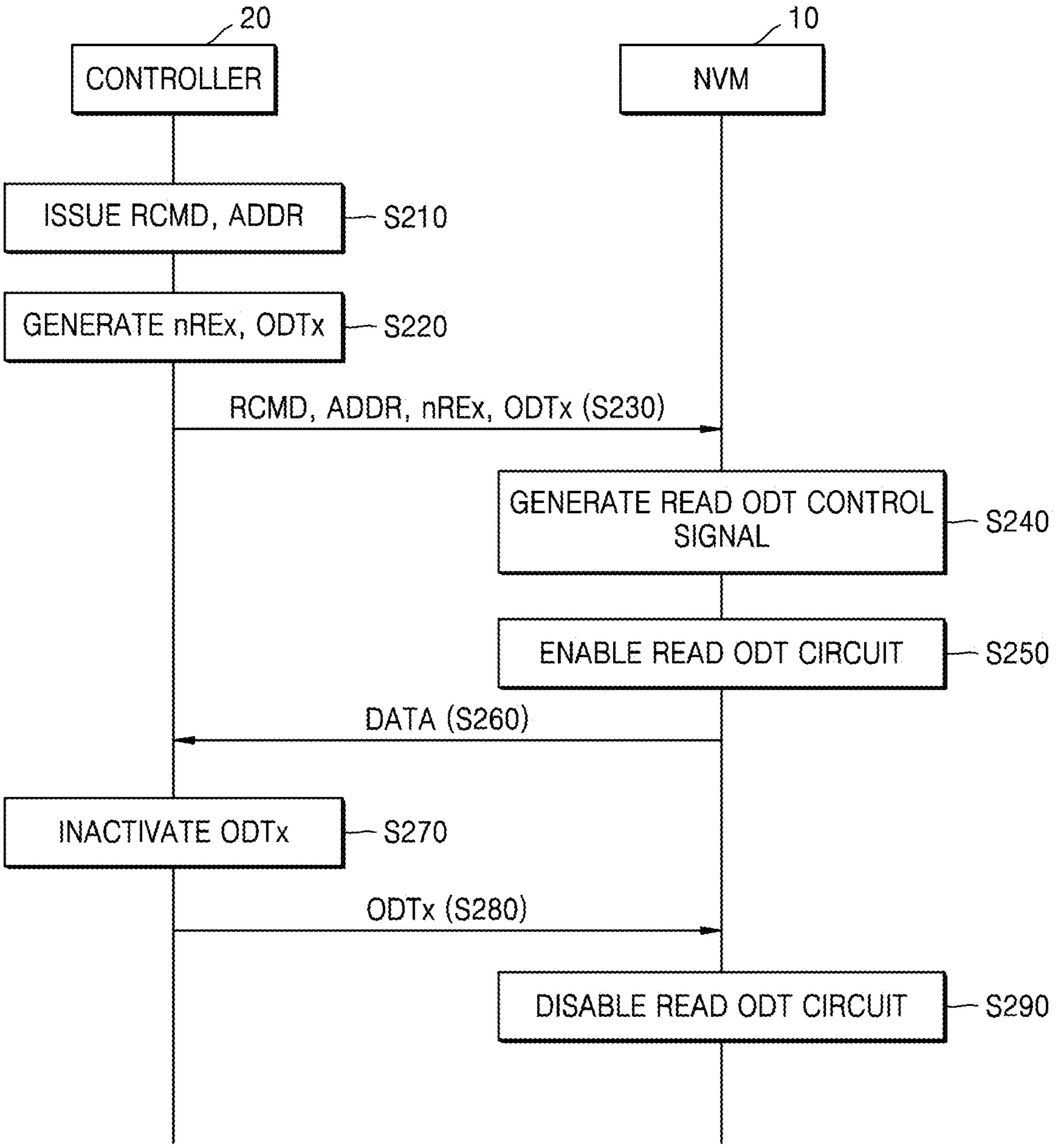
FIG. 14 is a flowchart of a read operation between a nonvolatile memory and a controller, according to an embodiment.

FIG. 14 is a flowchart of a read operation between the NVM 10 and the controller 20, according to an exemplary embodiment of the inventive concept. For example, the NVM 10 and the controller 20 may correspond to the NVM 10 and the controller 20 of FIG. 4.

In operation S210, the controller 20 generates a read command RCMD and an address ADDR. In operation S220, the controller 20 generates a read enable signal nREx and an ODT signal ODTx. According to an embodiment, operations S210 and S220 are substantially simultaneously performed. In operation S230, the controller 20 transmits the read command WCMD, the address ADDR, the read enable signal nREx, and the ODT signal ODTx to the NVM 10.

In operation S240, the NVM 10 determines the ODT mode as a read ODT mode based on the read enable signal nREx and the ODT signal ODTx, and generates the read ODT control signal. For example, the first and second memory chips 100 and 200 included in the NVM 10 may determine the ODT mode as the read ODT mode based on the read enable signal nREx and the ODT signal ODTx, and may generate the read ODT control signal. In operation S250, the NVM 10 enables the read ODT circuit. For example, the first memory chip 100 included in the NVM 10 may enable the read ODT circuit 101*c* and the second memory chip 200 included in the NVM 10 may enable the read ODT circuit 201*c*. In operation S260, the NVM 10 transmits the read data to the controller 20.

In operation S270, the controller 20 inactivates the ODT signal ODTx, and in operation S280, the controller 20 transmits the inactivated ODT signal ODTx to the NVM 10. In operation S290, the NVM 10 disables the read ODT circuit based on the inactivated ODT signal ODTx. For example, the first memory chip 100 included in the non-volatile memory 10 may disable the read ODT circuit 101*c* based on the inactivated ODT signal ODTx, and the second memory chip 200 included in the NVM 10 may disable the read ODT circuit 201*c* based on the inactivated ODT signal ODTx.

Figure 15:
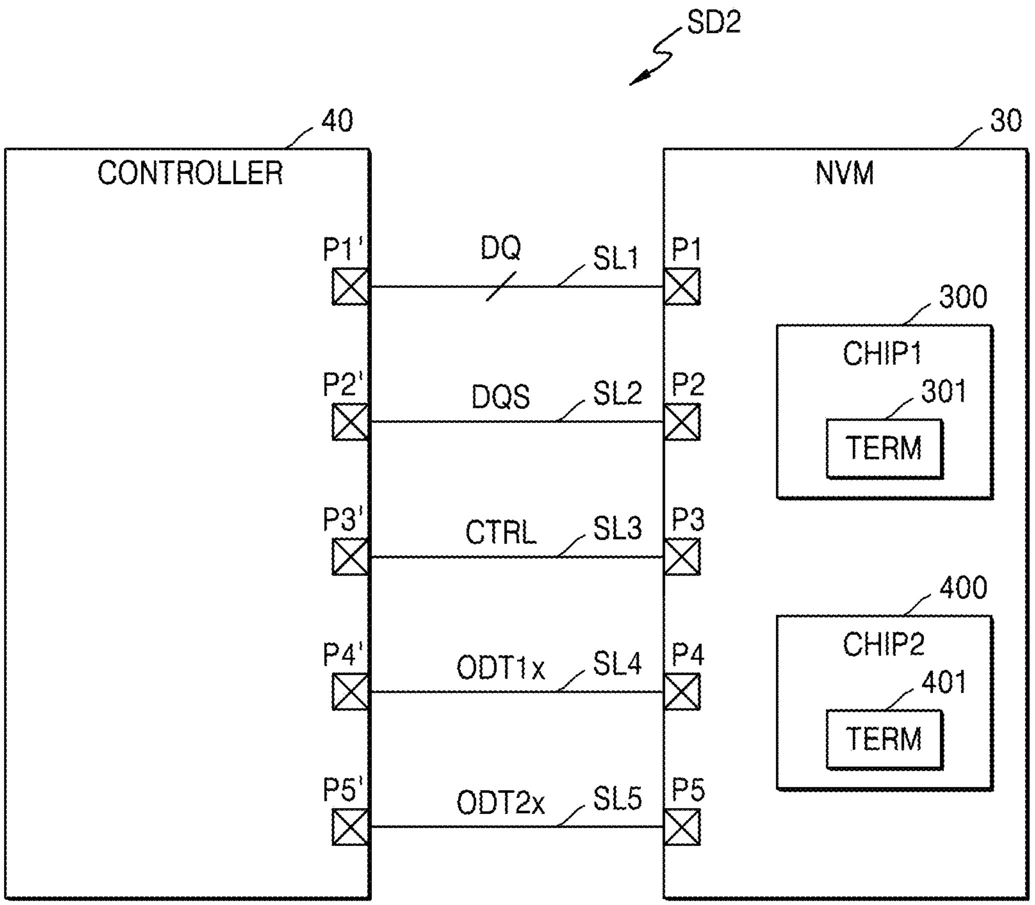
FIG. 15 is a block diagram schematically showing a storage device according to an exemplary embodiment of the inventive concept.

FIG. 15 is a block diagram schematically showing a storage device SD2 according to an exemplary embodiment of the inventive concept.

Referring to FIG. 15, the storage device SD2 includes an NVM 30 and a controller 40, and the NVM 30 includes first and second memory chips 300 and 400. The first memory chip 300 includes an ODT circuit 301 and the second memory chip 400 includes an ODT circuit 401. The storage device SD2 may correspond to a modified example of the storage device SD1 of FIG. 1, and the aspects described in detail with reference to FIGS. 1 through 14 may be applied to the present embodiment. Hereinafter, descriptions will be given by focusing on differences between the storage device SD1 of FIG. 1 and the storage device SD2 according to the present embodiment.

The NVM 30 and the controller 40 communicate with each other via first through fifth signal lines SL1 through SL5. Commands and addresses may be transmitted via the first signal lines SL1, and next, the data DQ may be transmitted via the first signal lines SL1. The data strobe signal DQS may be transmitted via the second signal line SL2. The control signal CTRL may be transmitted via the third signal line SL3. A first ODT signal ODT1*x* may be transmitted via the fourth signal line SL4 and a second ODT signal ODT2*x* may be transmitted via the fifth signal line SL5.

The controller 40 generates the first and second ODT signals ODT1*x* and ODT2*x* to control the ODT circuits 301 and 401 and the control signal CTRL to control operations of the first and second memory chips 300 and 400. According to an embodiment, the control signal CTRL includes a read enable signal for enabling a read operation of the first and second memory chips 300 and 400.

The NVM 30 includes first through fifth pins P1 through P5, and the first and second memory chips 300 and 400 may be commonly connected to each of the first through fifth pins P1 through P5. The first pins P1 are connected to the first signal lines SL1, respectively. The second through fifth pins P2 through P5 are connected to the second through fifth signal lines SL2 through SL5, respectively. Meanwhile, the controller 40 includes first through fifth pins P1' through P5' connected to the first through fifth signal lines SL1 through SL5, respectively.

According to the present embodiment, the NVM 30 receives the first and second ODT signals ODT1*x* and ODT2*x* from the controller 40 via the fourth and fifth pins P4 and P5, respectively. For example, the first ODT signal ODT1*x* is a signal configured to control write ODT circuits (for example, 301*a*, 301*b*, 401*a*, and 401*b* of FIG. 16) and defines an enable section of the write ODT circuits (e.g., defines when to enable or disable the write ODT circuits). For example, the second ODT signal ODT2*x* is a signal configured to control read ODT circuits (for example, 301*c* and 401*c* of FIG. 16) and defines an enable section of the read ODT circuits (e.g., defines when to enable or disable the read ODT circuits). Accordingly, the non-selected first memory chip 300 may enable the ODT circuit 301 based on the first and second ODT signals ODT1*x* and ODT2*x*, so as to prohibit reflection of signals from the first memory chip 300 in a stand-by state. Thus, the signal integrity margin may be improved.

Figure 16:
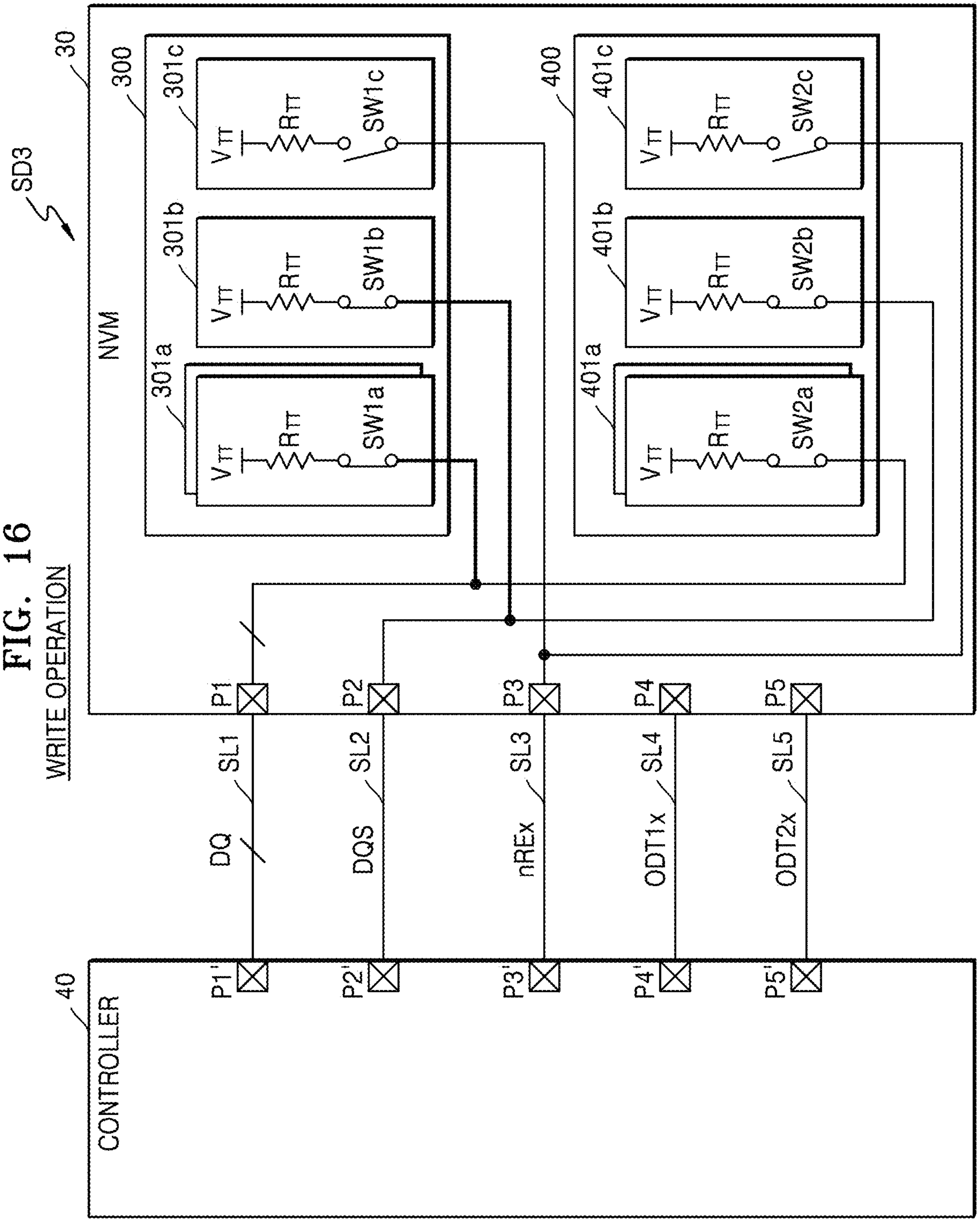
FIG. 16 shows connection of ODT circuits during a write operation of the storage device of FIG. 15

FIG. 16 shows connection of the ODT circuits 301*a*, 301*b*, 301*c*, 401*a*, 401*b*, and 401*c* during a write operation of the storage device SD2 of FIG. 15.

Referring to FIG. 16, the second memory chip 400 is selected and the first memory chip 300 is non-selected for the write operation. In an embodiment, the controller 40 generates chip enable signals with respect to the first and second memory chips 300 and 400, the read enable signal nREx, and the first and second ODT signals ODT1*x* and ODT2*x*. For example, the chip enable signal with respect to the first memory chip 300 is inactivated, the chip enable signal with respect to the second memory chip 400 is activated, the read enable signal nREx and the second ODT signal ODT2*x* are inactivated, and the first ODT signal ODT1*x* is activated.

The non-selected first memory chip 300 determines an operation performed with respect to the second memory chip 400 as a write operation, based on the activated first ODT signal ODT1*x*. The non-selected first memory chip 300 enables the first and second ODT circuits 301*a* and 301*b* based on the first ODT signal ODT1*x*, and disables the third ODT circuit 301*c*. Accordingly, ODT switches SW1*a* respectively included in the first ODT circuits 301*a* are turned on, and ODT resistors $R_{TT}$ are respectively connected to the first signal lines SL1 so as to prohibit reflection of the data signal DQ transmitted via the first signal lines SL1. Also, an ODT switch SW1*b* included in the second ODT circuit 301*b* is turned on, and the ODT resistor $R_{TT}$ is connected to the second signal line SL2 so as to prohibit reflection of the data strobe signal DQS transmitted via the second signal line SL2.

Likewise, the selected second memory chip 400 enables the first and second ODT circuits 401*a* and 401*b* based on the first ODT signal ODT1*x*, and disables the third ODT circuit 401*c*. However, the present inventive concept is not limited thereto. In some embodiments, the selected second memory chip 400 determines whether to enable the first and second ODT circuits 401*a* and 401*b* by further taking into account a chip selection signal, etc., and may disable the first and second ODT circuits 401*a* and 401*b*.

Figure 17:
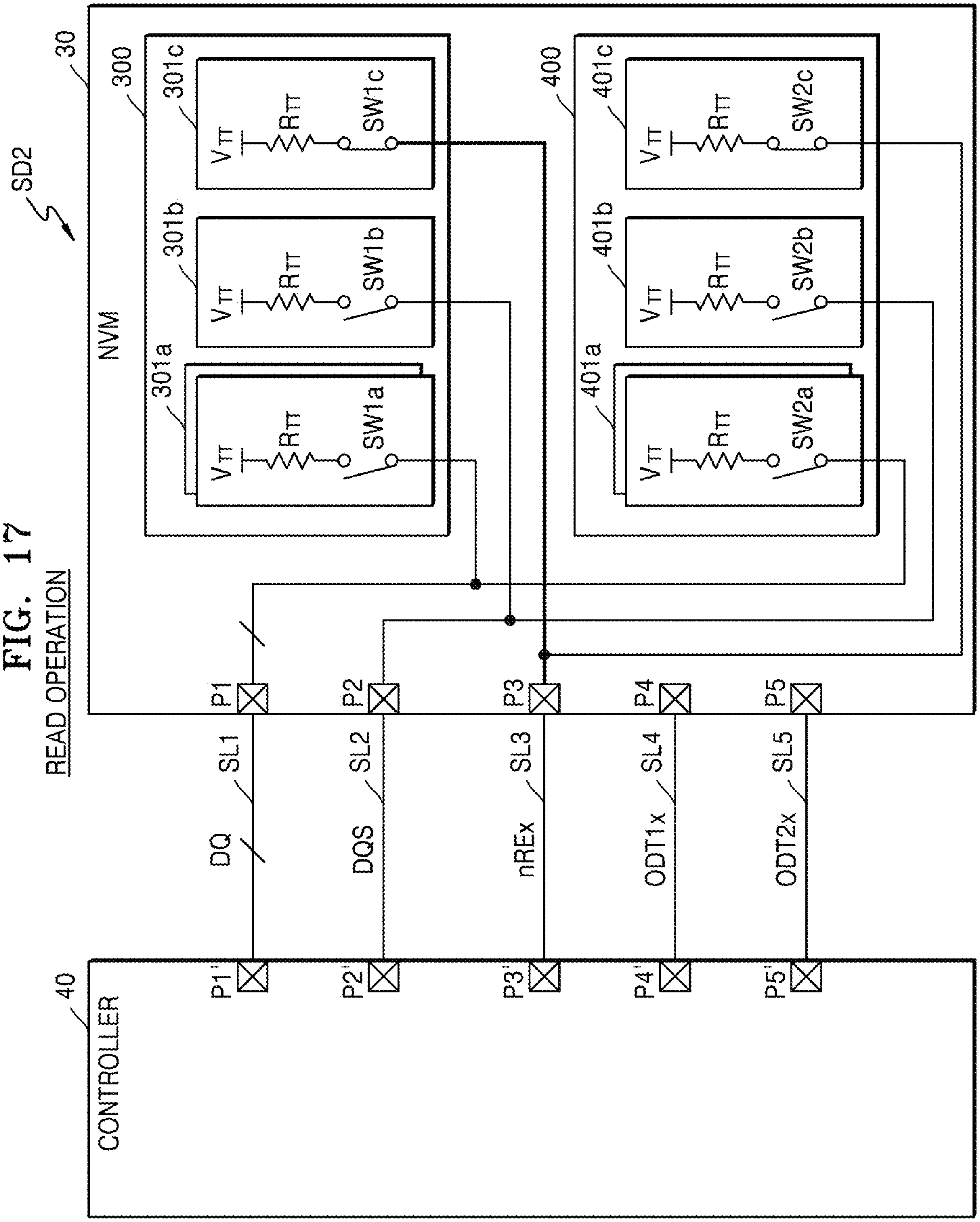
FIG. 17 shows connection of ODT circuits during a read operation of the storage device of FIG. 15.

FIG. 17 shows connection of the ODT circuits 301*a*, 301*b*, 301*c*, 401*a*, 401*b*, and 401*c* during a read operation of the storage device SD2 of FIG. 15.

Referring to FIG. 17, the second memory chip 400 is selected and the first memory chip 300 is non-selected for the read operation. In an embodiment, the controller 40 generates the chip enable signals with respect to the first and second memory chips 300 and 400, the read enable signal nREx, and the first and second ODT signals ODT1*x* and ODT2*x*. For example, the chip enable signal with respect to the first memory chip 300 is inactivated, the chip enable signal with respect to the second memory chip 400 is activated, the read enable signal nREx and the second ODT signal ODT2*x* are activated, and the first ODT signal ODT1*x* is inactivated.

The non-selected first memory chip 300 determines an operation performed with respect to the second memory chip 400 is a read operation based on the activated second ODT signal ODT2*x*. The non-selected first memory chip 300 disables the first and second ODT circuits 301*a* and 301*b* based on the second ODT signal ODT2*x*, and enables the third ODT circuit 301*c*. Accordingly, an ODT switch SW1*c* included in the third ODT circuit 301*c* is turned on, and the ODT resistor $R_{TT}$ is connected to the third signal line SL3 so as to prohibit reflection of the read enable signal nREx transmitted via the third signal line SL3.

Likewise, the selected second memory chip 400 disables the first and second ODT circuits 401*a* and 401*b* based on the second ODT signal ODT2*x* and enables the third ODT circuit 401*c*. However, the present inventive concept is not limited thereto. In an exemplary embodiment, the selected second memory chip 400 determines whether to enable the third ODT circuit 401*c* by further taking into account a chip selection signal, etc., and disables the third ODT circuit 401*c*.

Figure 18:
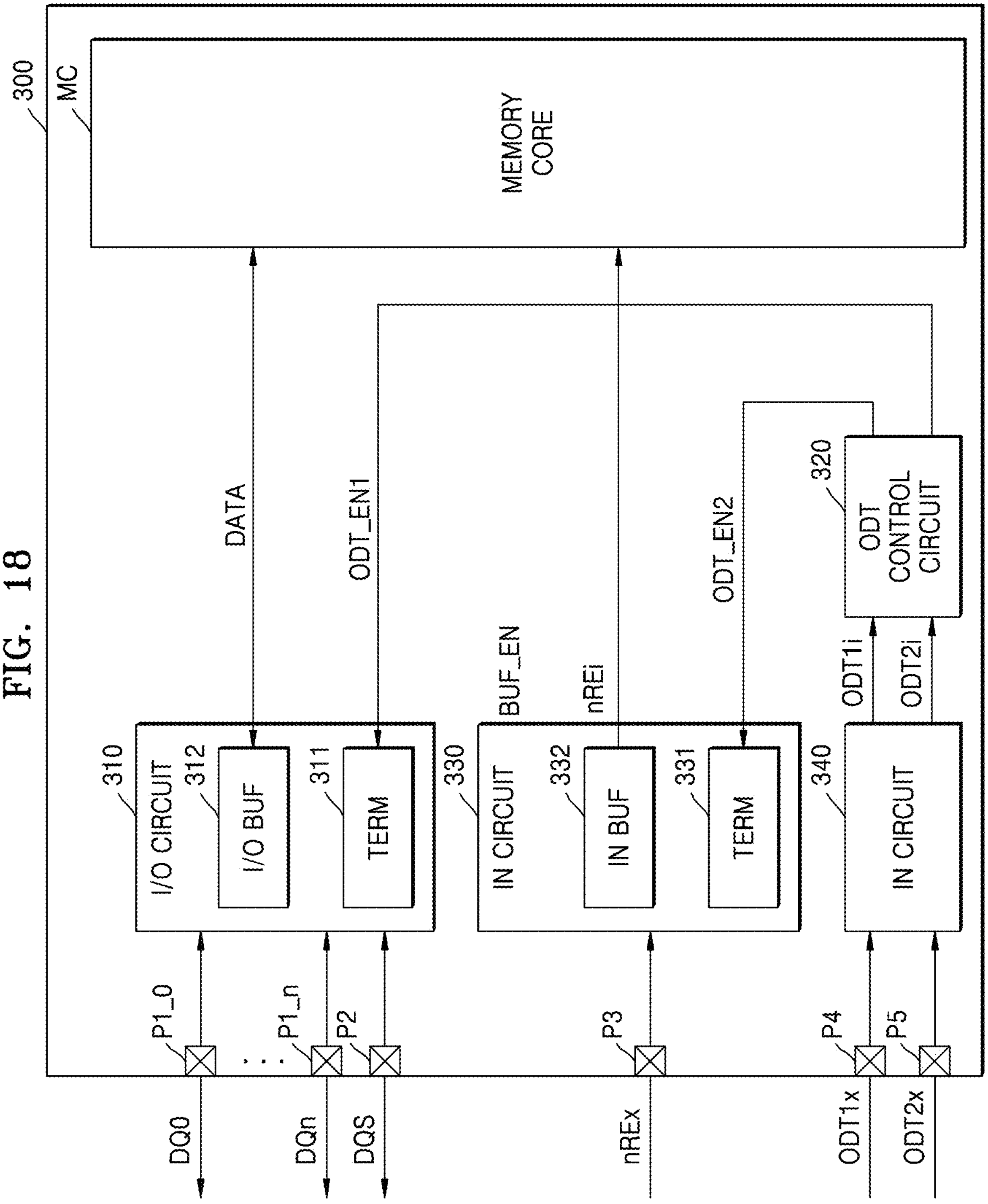
FIG. 18 is a block diagram showing in detail a first memory chip according to an exemplary embodiment of the inventive concept.

FIG. 18 is a block diagram showing in detail the first memory chip 300 according to an exemplary embodiment of the inventive concept. For example, the first memory chip 300 may correspond to the first memory chip 300 of FIG. 15. However, structures of the first memory chip 300 are not limited to the structure of the first memory chip 300 of FIG. 15, and may be applied to the second memory chip 400.

Referring to FIG. 18, the first memory chip 300 includes an input and output circuit 310, an ODT control circuit 320, and first and second input circuits 330 and 340. Also, the first memory chip 300 further includes the memory core MC. The memory core MC may include a memory cell array, a row decoder, a page buffer, a voltage generator, etc., and may be referred to as a data path circuit. The second memory chip 400 may be substantially similarly implemented as the first memory chip 300.

The input and output circuit 310 include ODT circuits 311 and an input and output buffer 312. The input and output circuit 310 transmits and receives the plurality of data signals DQ0 through DQn via the plurality of first pins P1_0 through P1_*n*, and transmits and receives the data strobe signal DQS via the second pin P2. Here, n is a positive integer, for example, 7. The input and output buffer 312 outputs data to the memory core MC or receives data from the memory core MC. For example, the ODT circuits 311 may include the first and second ODT circuits 301*a* and 301*b* of FIGS. 16 and 17.

The first input circuit 330 receives the read enable signal nREx via the third pin P3. The input circuit 330 includes an ODT circuit 331 and an input buffer 332. The input buffer 332 receives the read enable signal nREx and buffers the received read enable signal nREx to output the internal read enable signal nREi. The ODT circuit 331 may include the third ODT circuit 301*c* of FIGS. 16 and 17.

The second input circuit 340 receives the first and second ODT signals ODT1*x* and ODT2*x* via the fourth and fifth pins P4 and P5, respectively, and outputs first and second internal ODT signals ODT1*i* and ODT2*i* based on the received first and second ODT signals ODT1*x* and ODT2*x*. For example, the second input circuit 340 may include input buffers and the input buffers may buffer the first and second ODT signals ODT1*x* and ODT2*x* to output the first and second internal ODT signals ODT1*i* and ODT2*i*, respectively.

The ODT control circuit 320 determines an ODT mode based on the first and second internal ODT signals ODT1*i* and ODT2*i*, and generates the first and second ODT control signals ODT_EN1 and ODT_EN2 to control the ODT circuits 311 and 321, respectively, based on the determined ODT mode. For example, when the first internal ODT signal ODT1*i* is activated, the ODT control circuit 320 determines the ODT mode is a write ODT mode and activates the first ODT control signal ODT_EN1. For example, when the second internal ODT signal ODT2*i* is activated, the ODT control circuit 320 determines the ODT mode is a read ODT mode and activates the second ODT control signal ODT_EN2.

Figure 19A:
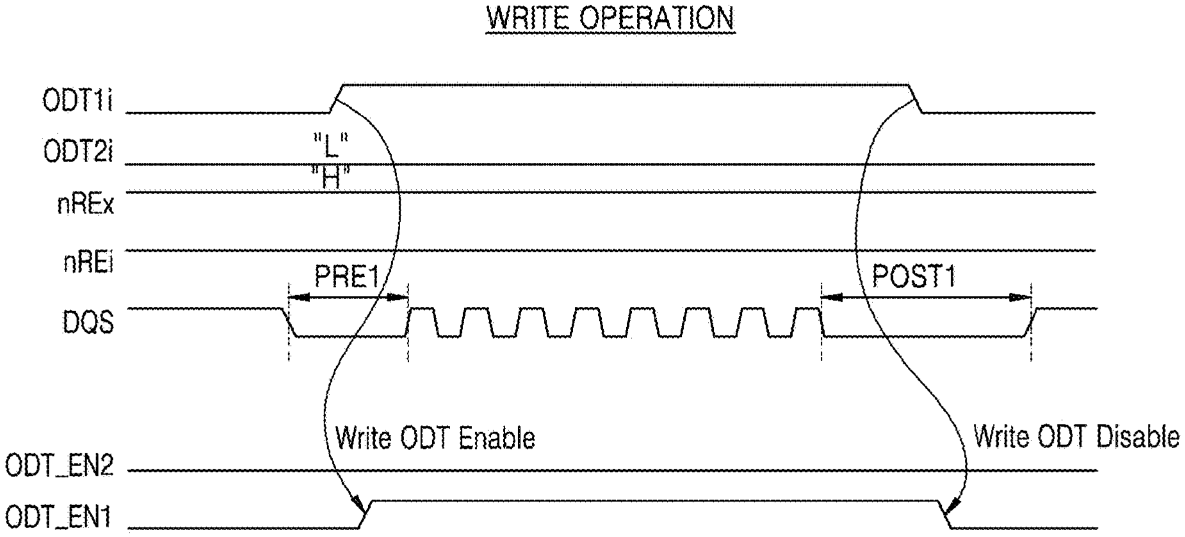
FIG. 19A is a timing view of a write operation according to an embodiment and FIG. 19B is a timing view of a read operation according to an embodiment.
Figure 19B:
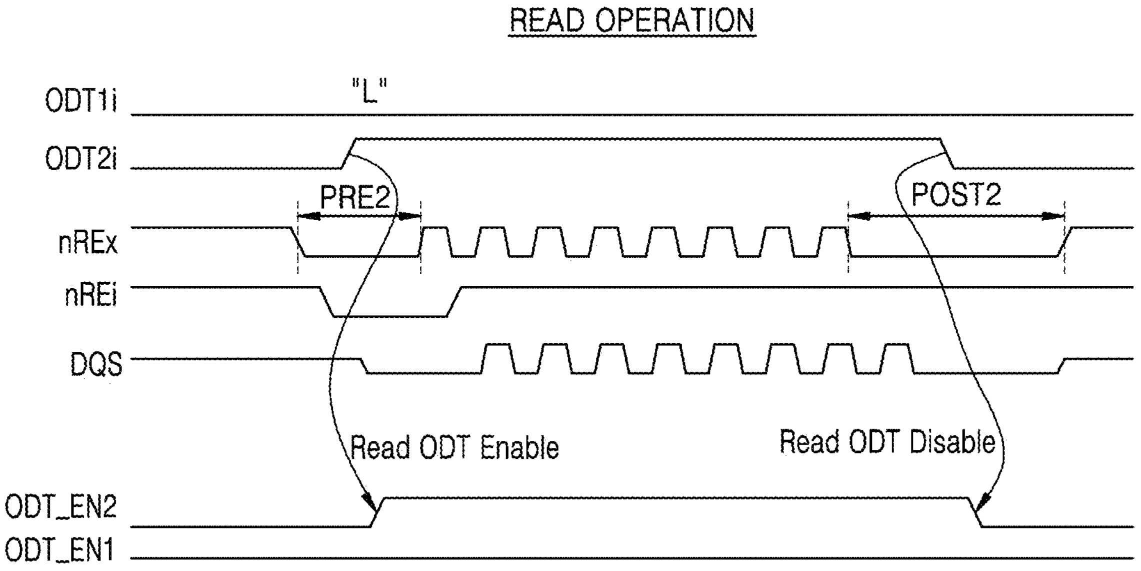

FIG. 19A is a timing diagram of a write operation according to an embodiment and FIG. 19B is a timing diagram of a read operation according to an embodiment.

Referring to FIGS. 18 and 19A, the read enable signal nREx is a logic "high" and thus, the internal read enable signal nREi is also a logic "high." The first internal ODT signal ODT1*i* is activated to an enable level, for example, a logic "high," in the preamble section PRE1 of the data strobe signal DQS, and is inactivated to a disable level, for example, a logic "low," in the post-amble section POST1 of the data strobe signal DQS. When the first internal ODT signal ODT1*i* is activated, that is, at the activation point of the first internal ODT signal ODT1*i* or when the first internal ODT signal ODT1*i* is enabled, the ODT control circuit 320 determines the ODT mode as the write ODT mode, and activates the first ODT control signal ODT_EN1 based on the determined write ODT mode. For example, the activation point of the first internal ODT signal ODT1*i* may correspond to a rising edge of the first internal ODT signal ODT1*i*. However, the present inventive concept is not limited thereto. In some embodiments, the activation point of the first internal ODT signal ODT1*i* corresponds to a falling edge of the first internal ODT signal ODT1*i*. For example, the ODT control circuit 320 may be designed to detect a logic level of the internal read enable signal nREi at the falling edge of the first internal ODT signal ODT1*i*.

Next, the ODT control circuit 320 inactivates the first ODT control signal ODT_EN1 at an inactivation point of the first internal ODT signal ODT1*i*, that is, when the first internal ODT signal ODT1*i* is disabled (e.g., at the falling edge). According to an embodiment, the ODT control circuit 320 detects the logic level of the internal read enable signal nREi at the falling edge of the first internal ODT signal ODT1*i*, and when the detected logic level is "high," the ODT control circuit 320 determines that the write operation of the second memory chip 400 has completed, and inactivates the first ODT control signal ODT_EN1.

Referring to FIGS. 18 and 19B, the second internal ODT signal ODT2*i* is activated to a logic "high" in the preamble section PRE2 of the read enable signal nREx, and is inactivated to a logic "low" in the post-amble section POST2 of the read enable signal nREx. The internal read enable signal nREi transitions to a logic "low" in the preamble section PRE2 of the read enable signal nREx and maintains a logic "high" after a toggling section of the read enable signal nREx. The ODT control circuit 320 determines the ODT mode is a read ODT mode, at the activation point of the second internal ODT signal ODT2*i*, for example, at a rising edge of the second internal ODT signal ODT2*i*, and activates the second ODT control signal ODT_EN2 based on the determined read ODT mode.

Next, the ODT control circuit 320 inactivates the second ODT control signal ODT_EN2 at the inactivation point of the second internal ODT signal ODT2*i*, for example, at the falling edge of the second internal ODT signal ODT2*i*. According to an embodiment, the ODT control circuit 320 detects a logic level of the internal read enable signal nREi at the falling edge of the second internal ODT signal ODT2*i*, and when the detected logic level is "low" determines that the read operation of the selected second memory chip 400 has completed and inactivates the second ODT control signal ODT_EN2.

Figure 20:
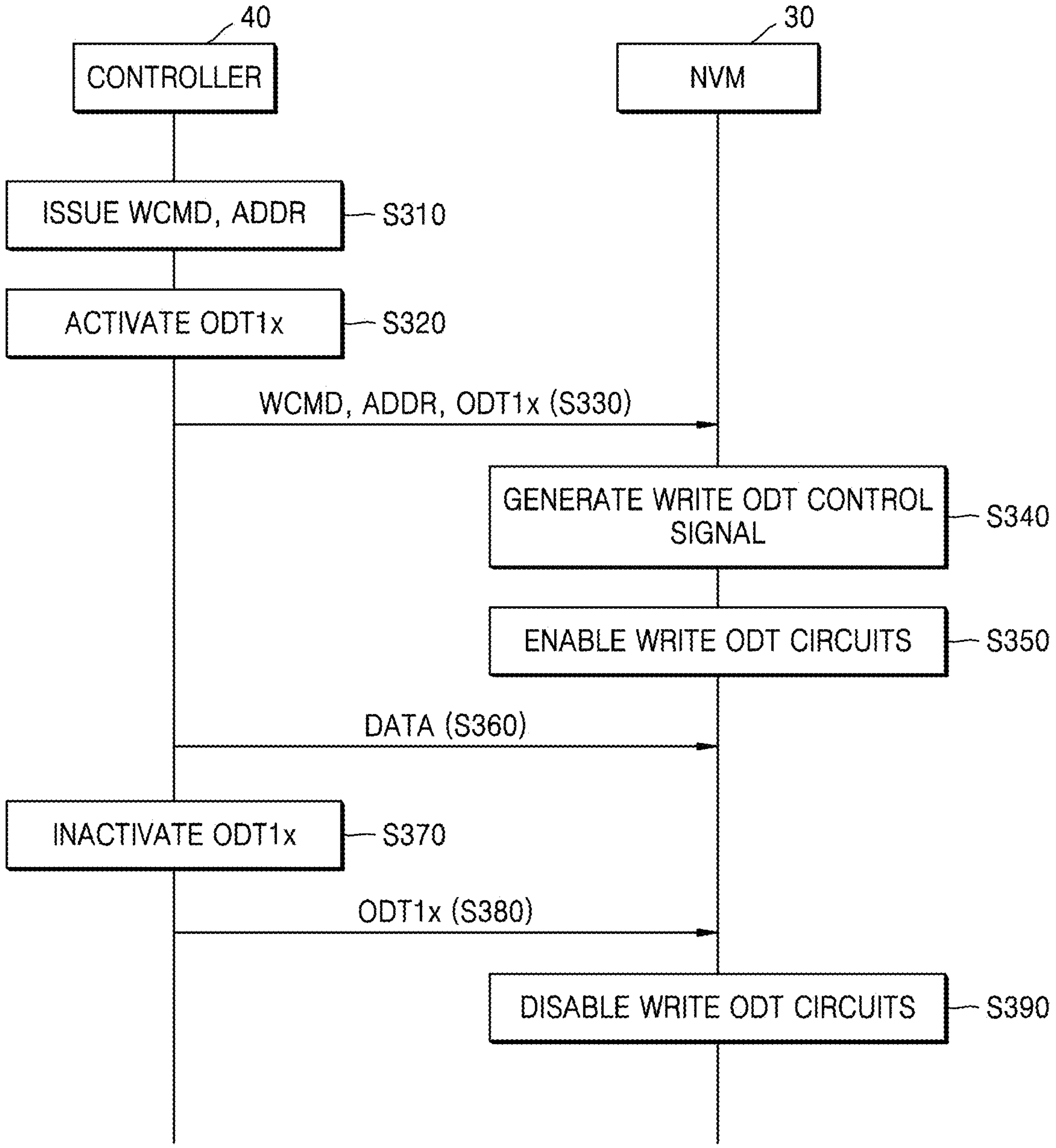
FIG. 20 is a flowchart of a write operation between a nonvolatile memory and a controller, according to an embodiment.

FIG. 20 is a flowchart of a write operation between the NVM 30 and the controller 40, according to an exemplary embodiment of the inventive concept. For example, the NVM 30 and the controller 40 may correspond to the NVM 30 and the controller 40 of FIG. 16.

In operation S310, the controller 40 generates a write command WCMD and an address ADDR. In operation S320, the controller 40 activates the first ODT signal ODT1*x*. According to an embodiment, operations S310 and S320 are substantially simultaneously performed. In operation S330, the controller 40 transmits the write command WCMD, the address ADDR, and the first ODT signal ODT1*x* to the NVM 30. For example, the write command WCMD and the address ADDR may be transmitted to the NVM 30 from the controller 40 via the first signal lines SL1, and the first ODT signal ODTx may be transmitted to the NVM 30 from the controller 40 via the fourth signal line SL4.

In operation S340, the NVM 30 determines an ODT mode is a write ODT mode based on the first ODT signal ODT1*x* and generates a write ODT control signal. For example, the first and second memory chips 300 and 400 included in the NVM 30 may determine the ODT mode is the write ODT mode based on the first ODT signal ODT1*x* and generate the write ODT control signal. In operation S350, the NVM 30 enables the write ODT circuits. For example, the first memory chip 300 included in the NVM 30 may enable the write ODT circuits 301*a* and 301*b* and the second memory chip 400 included in the NVM 30 may enable the write ODT circuits 401*a* and 401*b*. In operation S360, the controller 40 transmits data for writing to the NVM 30. For example, the data signals DQ and the data strobe signal DQS may be transmitted to the NVM 30 from the controller 40 via the first and second signal lines SL1 and SL2, respectively. In some embodiments, operation S350 is performed after operation S360.

In operation S370, the controller 40 inactivates the first ODT signal ODT1*x*, and in operation S380, the controller 40 transmits the inactivated first ODT signal ODT1*x* to the NVM 30. In operation S390, the NVM 30 disables the write ODT circuits based on the inactivated first ODT signal ODT1*x*. For example, the first memory chip 300 included in the NVM 30 may disable the write ODT circuits 301*a* and 301*b* based on the inactivated first ODT signal ODT1*x*, and the second memory chip 400 included in the NVM 30 may disable the write ODT circuits 401*a* and 401*b* based on the inactivated first ODT signal ODT1*x*.

Figure 21:
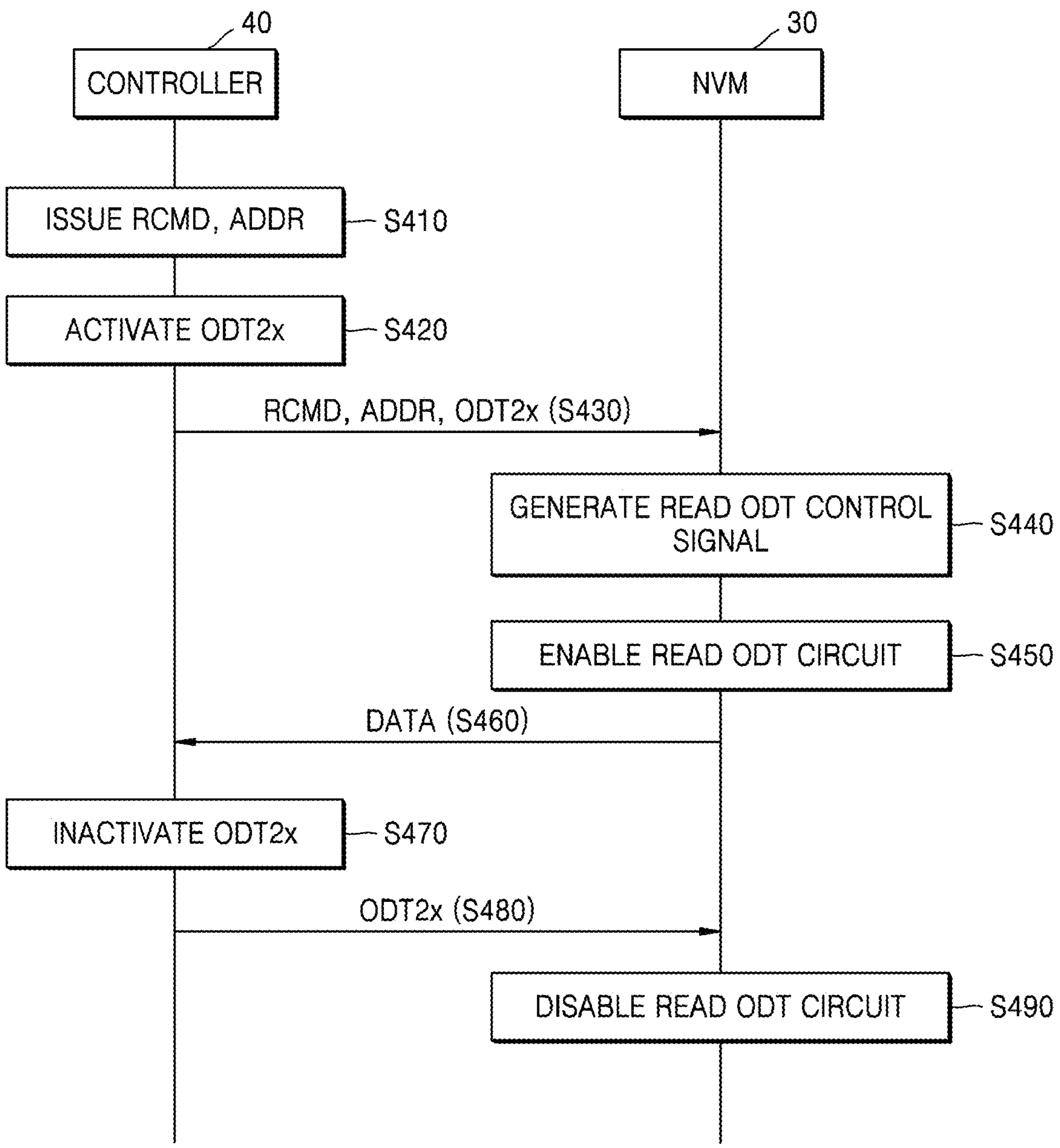
FIG. 21 is a flowchart of a read operation between a nonvolatile memory and a controller, according to an embodiment.

FIG. 21 is a flowchart of a read operation between the NVM 30 and the controller 40, according to an exemplary embodiment of the inventive concept. For example, the NVM 30 and the controller 40 may correspond to the NVM 30 and the controller 40 of FIG. 17.

In operation S410, the controller 40 generates a read command RCMD and an address ADDR. In operation S420, the controller 40 activates the second ODT signal ODT2*x*. According to an embodiment, operations S410 and S420 are substantially simultaneously performed. In operation S430, the controller 40 transmits the read command RCMD, the address ADDR, and the second ODT signal ODT2*x* to the NVM 30.

In operation S440, the NVM 30 determines an ODT mode is a read ODT mode based on the activated second ODT signal ODT2*x*, and generates a read ODT control signal. For example, the first and second memory chips 300 and 400 included in the NVM 30 may determine the ODT mode as the read ODT mode based on the second ODT signal ODT2*x* and generate the read ODT control signal. In operation S450, the NVM 30 enables the read ODT circuit. For example, the first memory chip 300 included in the NVM 30 may enable the read ODT circuit 301*c* and the second memory chip 400 included in the NVM 30 may enable the read ODT circuit 401*c*. In operation S450, the NVM 30 transmits the read data to the controller 40.

In operation S470, the controller 40 inactivates the second ODT signal ODT2*x*, and in operation S480, the controller 40 transmits the inactivated second ODT signal ODT2*x* to the NVM 30. In operation S490, the NVM 30 disables the read ODT circuit based on the inactivated second ODT signal ODT2*x*. For example, the first memory chip 300 included in the NVM 30 may disable the read ODT circuit 301*c* based on the inactivated second ODT signal ODT2*x* and the second memory chip 400 included in the NVM 30 may disable the read ODT circuit 401*c* based on the inactivated second ODT signal ODT2*x*.

Figure 22:
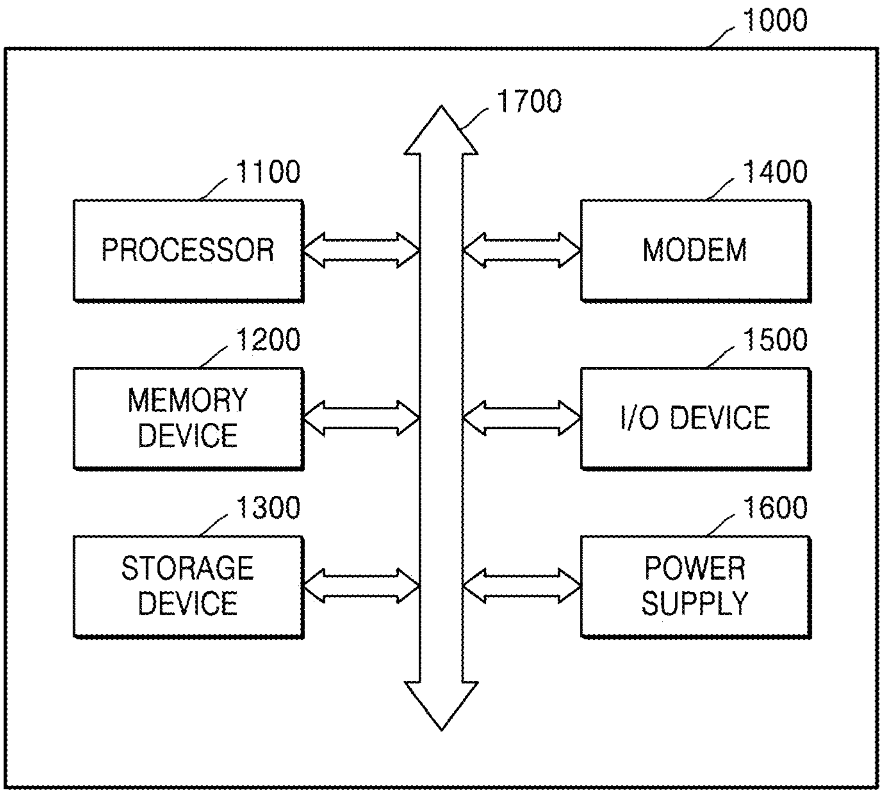
FIG. 22 is a block diagram showing an electronic apparatus according to an exemplary embodiment of the inventive concept.

FIG. 22 is a block diagram of an electronic apparatus 1000 according to an exemplary embodiment of the inventive concept. Referring to FIG. 22, the electronic apparatus 1000 includes a processor 1100, a memory device 1200, a storage device 1300, a modem 1400, an input and output device 1500, and a power supply 1600. According to the present embodiment, the storage device 1300 may be implemented according to the embodiments described in detail with reference to FIGS. 1 through 21. In detail, the storage device 1300 may include a NVM and a controller, and the NVM may include an ODT pin for receiving an ODT signal from the controller. Thus, when high speed communication is performed between the NVM and the controller in the storage device 1300, reflection of signals may be prohibited and command overhead may be reduced, so as to improve the performance of the storage device 1300 and the overall performance of the electronic apparatus 1000.

While the inventive concept has been particularly shown and described with reference to exemplary embodiments thereof, it will be understood by those of ordinary skill in the art that various modifications and equivalent other embodiments can be derived from the inventive concept.

What is claimed is:

1. A memory system comprising:

a nonvolatile memory (NVM) including a first NVM chip and a second NVM chip; and a controller configured to control the NVM, wherein the controller comprises:

a data pin configured to receive read data through a data bus during a read operation;

a data strobe pin configured to receive a data strobe signal through a data strobe signal bus during the read operation;

a read enable pin configured to transmit a read enable signal through a read enable signal bus during the read operation, the read enable signal comprising a preamble section, a toggling section and a postamble section; and an on-die termination (ODT) pin configured to transmit an ODT signal during the read operation, wherein the ODT signal enables and disables termination on at least one of the data bus, the data strobe signal bus, or the read enable signal bus, wherein the termination is enabled during the preamble section of the read enable signal after the read enable signal falling, and the termination is disabled during the postamble section of the read enable signal, wherein the first NVM chip includes a first ODT circuit, and the first ODT circuit is used to perform an ODT when the read data is read from the second NVM chip and the ODT signal is enabled.

2. The memory system of claim 1, wherein the first NVM chip further includes a second ODT circuit and a third ODT circuit, wherein the first ODT circuit is connected to the read enable signal bus, the second ODT circuit is connected to the data bus, and the third ODT circuit is connected to the data strobe signal bus, and wherein when the read data is read from the second NVM chip, the first ODT circuit is enabled to perform the ODT and the second and third ODT circuits are disabled.

3. The memory system of claim 1, wherein the controller is further configured to receive, while the termination is enabled, the read data in synchronization with the data strobe signal.

4. The memory system of claim 3, wherein the ODT signal maintains a first logic level during a time period in which the read data is transmitted from the NVM to the controller.

5. The memory system of claim 1, wherein the preamble section of the read enable signal is a first logic low section before the toggling section of the read enable signal, and the postamble section of the read enable signal is a second logic low section after the toggling section of the read enable signal.

6. A memory system comprising:

a nonvolatile memory (NVM) including a first NVM chip and a second NVM chip; and a controller configured to control the NVM, wherein the controller comprises:

a data pin configured to transmit write data through a data bus during a write operation;

a data strobe pin configured to transmit a data strobe signal through a data strobe signal bus during the write operation, the data strobe signal comprising a preamble section, a toggling section and a postamble section; and an on-die termination (ODT) pin configured to transmit an ODT signal during the write operation, wherein the ODT signal enables and disables termination on at least one of the data bus, the data strobe signal bus, or a read enable signal bus, wherein the termination is enabled during the preamble section of the data strobe signal after the data strobe signal falling, and the termination is disabled during the postamble section of the data strobe signal, wherein the first NVM chip includes a first ODT circuit, and the first ODT circuit is used to perform an ODT when the write data is written to the second NVM chip and the ODT signal is enabled.

7. The memory system of claim 6, wherein the first NVM chip further includes a second ODT circuit and a third ODT circuit, wherein the first ODT circuit is connected to the data bus, the second ODT circuit is connected to the data strobe signal bus, and the third ODT circuit is connected to the read enable signal bus, and wherein when the write data is written to the second NVM chip, the first and second ODT circuits are enabled to perform the ODT and the third ODT circuit is disabled.

8. The memory system of claim 6, wherein a read enable signal of the read enable signal bus maintains a logic high level during the write operation.

9. The memory system of claim 6, wherein the controller is configured to transmit, while the termination is enabled, the write data in synchronization with the data strobe signal.

10. The memory system of claim 9, wherein the ODT signal maintains a first logic level during a time period in which the write data is transmitted from the controller to the NVM.

11. The memory system of claim 6, wherein the preamble section of the data strobe signal is a first logic low section before the toggling section of the data strobe signal, and the postamble section of the data strobe signal is a second logic low section after the toggling section of the data strobe signal.

12. A nonvolatile memory (NVM) device comprising:

a first NVM chip and a second NVM chip;

a data pin configured to transmit read data to a controller through a data bus during a read operation;

a data strobe pin configured to transmit a data strobe signal to the controller through a data strobe signal bus during the read operation;

a read enable pin configured to receive a read enable signal from the controller through a read enable signal bus during the read operation, the read enable signal comprising a preamble section, a toggling section and a postamble section; and an on-die termination (ODT) pin configured to receive an ODT signal from the controller during the read operation, wherein the ODT signal enables and disables termination on at least one of the data bus, the data strobe signal bus, or the read enable signal bus, wherein the termination is enabled during the preamble section of the read enable signal after the read enable signal falling, and the termination is disabled during the postamble section of the read enable signal, wherein the first NVM chip includes a first ODT circuit, and the first ODT circuit is used to perform an ODT when the read data is read from the second NVM chip and the ODT signal is enabled.

13. The NVM device of claim 12, wherein the NVM device is further configured to transmit, while the termination is enabled, the read data to the controller in synchronization with the data strobe signal.

14. The NVM device of claim 13, wherein the ODT signal maintains a first logic level during a time period in which the read data is transmitted to the controller.

15. The NVM device of claim 12, wherein the preamble section of the read enable signal is a first logic low section before the toggling section of the read enable signal, and the postamble section of the read enable signal is a second logic low section after the toggling section of the read enable signal.

16. A nonvolatile memory (NVM) device comprising:

a first NVM chip and a second NVM chip;

a data pin configured to receive write data from a controller through a data bus during a write operation;

a data strobe pin configured to receive a data strobe signal from the controller through a data strobe signal bus during the write operation, the data strobe signal comprising a preamble section, a toggling section and a postamble section; and an on-die termination (ODT) pin configured to receive an ODT signal from the controller during the write operation, wherein the ODT signal enables and disables termination on at least one of the data bus, the data strobe signal bus, or a read enable signal bus, wherein the termination is enabled during the preamble section of the data strobe signal after the data strobe signal falling, and the termination is disabled during the postamble section of the data strobe signal, wherein the first NVM chip includes a first ODT circuit, and the first ODT circuit is used to perform an ODT when the write data is written to the second NVM chip and the ODT signal is enabled.

17. The NVM device of claim 16, wherein a read enable signal of the read enable signal bus maintains a logic high level during the write operation.

18. The NVM device of claim 16, wherein the NVM device is configured to receive, while the termination is enabled, the write data in synchronization with the data strobe signal.

19. The NVM device of claim 18, wherein the ODT signal maintains a first logic level during a time period in which the write data is received from the controller.

20. The NVM device of claim 16, wherein the preamble section of the data strobe signal is a first logic low section before the toggling section of the data strobe signal, and the postamble section of the data strobe signal is a second logic low section after the toggling section of the data strobe signal.

* * * * *